United States Patent
Lee et al.

(10) Patent No.: US 10,211,154 B2
(45) Date of Patent: Feb. 19, 2019

(54) THREE-DIMENSIONAL SEMICONDUCTOR DEVICE

(71) Applicant: Samsung Electronics Co., Ltd., Suwon-si (KR)

(72) Inventors: Sung-Hun Lee, Yongin-si (KR); Seokjung Yun, Iksan-si (KR); Chang-Sup Lee, Hwaseong-si (KR); Seong Soon Cho, Suwon-si (KR); Jeehoon Han, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 35 days.

(21) Appl. No.: 15/350,305

(22) Filed: Nov. 14, 2016

(65) Prior Publication Data

US 2017/0179028 A1 Jun. 22, 2017

(30) Foreign Application Priority Data

Dec. 18, 2015 (KR) .................. 10-2015-0182062

(51) Int. Cl.
| | |
|---|---|
| *H01L 23/528* | (2006.01) |
| *H01L 23/522* | (2006.01) |
| *H01L 27/115* | (2017.01) |
| *H01L 27/11578* | (2017.01) |
| *H01L 27/11551* | (2017.01) |

(Continued)

(52) U.S. Cl.
CPC .... *H01L 23/5283* (2013.01); *H01L 21/76816* (2013.01); *H01L 21/76877* (2013.01); *H01L 23/5226* (2013.01); *H01L 27/1157* (2013.01); *H01L 27/11551* (2013.01); *H01L 27/11556* (2013.01); *H01L 27/11565* (2013.01);

(Continued)

(58) Field of Classification Search
CPC .......... H01L 27/11529; H01L 27/1157; H01L 27/11551; H01L 27/11548; H01L 27/11573; H01L 27/11575; H01L 27/11582; H01L 27/11556; H01L 23/5283; H01L 27/11578; H01L 23/5226; H01L 21/76877; H01L 27/11565
See application file for complete search history.

(56) References Cited

U.S. PATENT DOCUMENTS

| | | | |
|---|---|---|---|
| 8,426,299 B2 | 4/2013 | Kim et al. | |
| 8,529,776 B2 | 9/2013 | Lee et al. | |

(Continued)

FOREIGN PATENT DOCUMENTS

| | | |
|---|---|---|
| JP | 2012094694 | 5/2012 |
| JP | 5782182 | 9/2015 |

(Continued)

*Primary Examiner* — Yu Chen
*Assistant Examiner* — Pauline Vu
(74) *Attorney, Agent, or Firm* — Onello & Mello, LLP

(57) ABSTRACT

A three-dimensional (3D) semiconductor device includes a stack structure including first and second stacks stacked on a substrate. Each of the first and second stacks includes a first electrode and a second electrode on the first electrode. A sidewall of the second electrode of the first stack is horizontally spaced apart from a sidewall of the second electrode of the second stack by a first distance. A sidewall of the first electrode is horizontally spaced apart from the sidewall of the second electrode by a second distance in each of the first and second stacks. The second distance is smaller than a half of the first distance.

15 Claims, 28 Drawing Sheets

(51) Int. Cl.
  *H01L 27/11556* (2017.01)
  *H01L 21/768* (2006.01)
  *H01L 27/1157* (2017.01)
  *H01L 27/11582* (2017.01)
  *H01L 27/11565* (2017.01)
  *H01L 27/11575* (2017.01)

(52) U.S. Cl.
  CPC .. *H01L 27/11575* (2013.01); *H01L 27/11578* (2013.01); *H01L 27/11582* (2013.01)

(56) References Cited

U.S. PATENT DOCUMENTS

| | | | |
|---|---|---|---|
| 8,530,350 | B2 | 9/2013 | Freeman et al. |
| 8,609,536 | B1 | 12/2013 | Ha et al. |
| 8,704,288 | B2 | 4/2014 | Lee et al. |
| 8,970,040 | B1 | 3/2015 | Chen |
| 8,999,844 | B2 | 4/2015 | Freeman et al. |
| 9,147,687 | B2 | 9/2015 | Koh et al. |
| 9,281,317 | B2 | 3/2016 | Higashitani et al. |
| 9,466,531 | B2 | 10/2016 | Freeman et al. |
| 2010/0213526 | A1* | 8/2010 | Wada ............... H01L 21/76808 257/314 |
| 2011/0092038 | A1* | 4/2011 | Choi ................ H01L 27/11526 438/268 |
| 2012/0068259 | A1* | 3/2012 | Park ................ H01L 27/0207 257/329 |
| 2012/0171861 | A1* | 7/2012 | Park ................ H01L 21/31144 438/639 |
| 2012/0211816 | A1* | 8/2012 | Yahashi ........... H01L 27/11573 257/314 |
| 2012/0238093 | A1* | 9/2012 | Park ................ H01L 21/76838 438/675 |
| 2012/0241843 | A1* | 9/2012 | Iino ................. H01L 21/76801 257/324 |
| 2012/0306089 | A1 | 12/2012 | Freeman et al. |
| 2012/0319173 | A1* | 12/2012 | Ko .................. H01L 27/0688 257/211 |
| 2013/0043509 | A1* | 2/2013 | Cho ................ H01L 27/11526 257/208 |
| 2013/0062683 | A1* | 3/2013 | Fukuzumi ........ H01L 29/66833 257/324 |
| 2013/0095653 | A1* | 4/2013 | Jin ................. H01L 27/11519 438/622 |
| 2013/0161821 | A1* | 6/2013 | Hwang ............ H01L 23/5283 257/773 |
| 2013/0341798 | A1 | 12/2013 | Freeman et al. |
| 2014/0054787 | A1* | 2/2014 | Eun ................ H01L 27/11548 257/773 |
| 2014/0106569 | A1* | 4/2014 | Oh ................. H01L 21/31144 438/703 |
| 2014/0197546 | A1* | 7/2014 | Hwang ............ H01L 23/528 257/774 |
| 2014/0284675 | A1* | 9/2014 | Watanabe ........ H01L 29/7926 257/314 |
| 2014/0367764 | A1 | 12/2014 | Lee et al. |
| 2015/0028410 | A1* | 1/2015 | Kato .............. H01L 29/792 257/324 |
| 2015/0129878 | A1 | 5/2015 | Shin et al. |
| 2015/0137216 | A1 | 5/2015 | Lee et al. |
| 2015/0214107 | A1 | 7/2015 | Freeman et al. |
| 2015/0228623 | A1* | 8/2015 | Oh ................. H01L 27/11575 257/4 |
| 2015/0263029 | A1* | 9/2015 | Kim ............... H01L 27/11575 257/314 |
| 2016/0027730 | A1* | 1/2016 | Lee ................ H01L 21/76816 257/774 |
| 2016/0322376 | A1* | 11/2016 | Lee ................ H01L 27/11529 |

FOREIGN PATENT DOCUMENTS

| | | |
|---|---|---|
| KR | 101048721 | 7/2011 |
| KR | 101521037 | 5/2015 |

* cited by examiner

THREE-DIMENSIONAL SEMICONDUCTOR DEVICE

CROSS-REFERENCE TO RELATED APPLICATION

This U.S. non-provisional patent application claims priority under 35 U.S.C. § 119 to Korean Patent Application No. 10-2015-0182062, filed on Dec. 18, 2015, in the Korean Intellectual Property Office, the disclosure of which is hereby incorporated by reference in its entirety.

BACKGROUND

Example embodiments of the inventive concepts relate to a three-dimensional (3D) semiconductor device and, more particularly, to a highly integrated 3D semiconductor memory device.

Semiconductor devices have been highly integrated in order to provide excellent performance and low manufacturing costs. The integration density of semiconductor devices directly affects the costs of the semiconductor devices, thereby resulting in a demand of highly integrated semiconductor devices. The integration density of a conventional two-dimensional (2D) or planar semiconductor devices may be mainly determined by the area a unit memory cell occupies. Therefore, the integration density of the conventional 2D semiconductor devices may be greatly affected by a technique of forming fine patterns. However, since, among other factors, extremely high-priced apparatuses are needed to form fine patterns, the integration density of 2D semiconductor devices continues to increase but is still limited. Three-dimensional (3D) semiconductor memory devices have been developed to overcome the above limitations. 3D semiconductor memory devices may include memory cells three-dimensionally arranged.

SUMMARY

Example embodiments of the inventive concepts may provide a three-dimensional (3D) semiconductor device capable of improving an integration density.

In an aspect, a 3D semiconductor device may include a substrate including a cell array region and a connection region, and a stack structure extending from the cell array region to the connection region. The stack structure may include a first stack and a second stack on the first stack, and each of the first and second stacks may include a first electrode and a second electrode on the first electrode. A sidewall of the second electrode of the first stack may be horizontally spaced apart from a sidewall of the second electrode of the second stack by a first distance in the connection region. A sidewall of the first electrode may be horizontally spaced apart from the sidewall of the second electrode by a second distance in each of the first and second stacks. The second distance may be less than a half of the first distance.

In an aspect, a 3D semiconductor device may include a substrate including a cell array region and a connection region, and a plurality of stacks vertically stacked on the substrate. Each of the stacks may have a pad portion disposed in the connection region, and each of the stacks may include a plurality of electrodes vertically stacked. Ends of top surfaces of the pad portions of the stacks may be horizontally spaced apart from each other by a first distance. In at least one of the pad portions of the stacks, a sidewall of an uppermost electrode may be horizontally spaced apart from a sidewall of a lowermost electrode by a second distance. The second distance may be less than a half of the first distance.

In an aspect, a 3D semiconductor device may include a substrate including a cell array region and a connection region, a stack structure including a plurality of stacks vertically stacked on the substrate, each of the stacks having a pad portion disposed in the connection region, and contact plugs connected to the pad portions of the stacks, respectively. Each of the pad portions of the stacks may include a plurality of electrodes vertically stacked. In at least one of the pad portions of the stacks, sidewalls of the electrodes may be horizontally spaced apart from each other between the contact plugs adjacent to each other.

In an aspect, a 3D semiconductor device may include a substrate including a cell array region and a connection region, and a stack structure extending in one direction on the substrate. The stack structure may include first electrodes and second electrodes that are alternately and vertically stacked on the substrate with an insulating layer interposed therebetween. Each of the first electrodes may have a first end portion exposed by the second electrode disposed on each of the first electrodes in the connection region. Each of the second electrodes may have a second end portion exposed by the first electrode disposed on each of the second electrodes in the connection region. The first end portion of the first electrode may have a first width in the one direction, and the second end portion of the second electrode may have a second width in the one direction. The first width may be less than a half of the second width.

In example embodiments a 3D semiconductor device includes a substrate including a cell array region and a connection region, a stack structure including a plurality of stacks vertically stacked on the substrate, each of the stacks extending from the cell array region into the connection region, wherein each subsequently higher stack extends a lesser distance into the connection region than the stack below it; and each stack includes a plurality of electrodes having sidewall and top surfaces with an uppermost electrode extending into the connection region a lesser distance than any other electrode within the stack, wherein a line defined by the intersections of the sidewall and top surfaces of the uppermost electrode in each stack forms an angle with the substrate that is less than an angle formed by a line defined by the intersections of the sidewalls and tops of electrodes within a stack and the substrate.

In example embodiments a 3D semiconductor device includes a plurality of vertical structures penetrating the stacks in the cell array region and a data storage layer disposed between each of the vertical structures and the stacks.

In example embodiments a 3D semiconductor device includes a vertical NAND (VNAND) device.

In example embodiments a semiconductor device includes a stacked structure that includes two stepwise structures, the two stepwise structures including a first stepwise structure defined by the steps of individual stacks within the stack structure and having the lesser angle with the substrate associated with it and a second stepwise structure defined by the steps of individual electrodes within individual stacks and having the greater angle with the substrate associated with it.

In example embodiments, a 3D semiconductor device includes a filling insulation layer formed on the substrate to cover the stack structure, conductive lines formed on top of the filling insulation layer and contact plugs connecting the conductive lines to pads associated electrodes within each stack.

BRIEF DESCRIPTION OF THE DRAWINGS

The inventive concepts will become more apparent in view of the attached drawings and accompanying detailed description.

DETAILED DESCRIPTION

Figure 1:
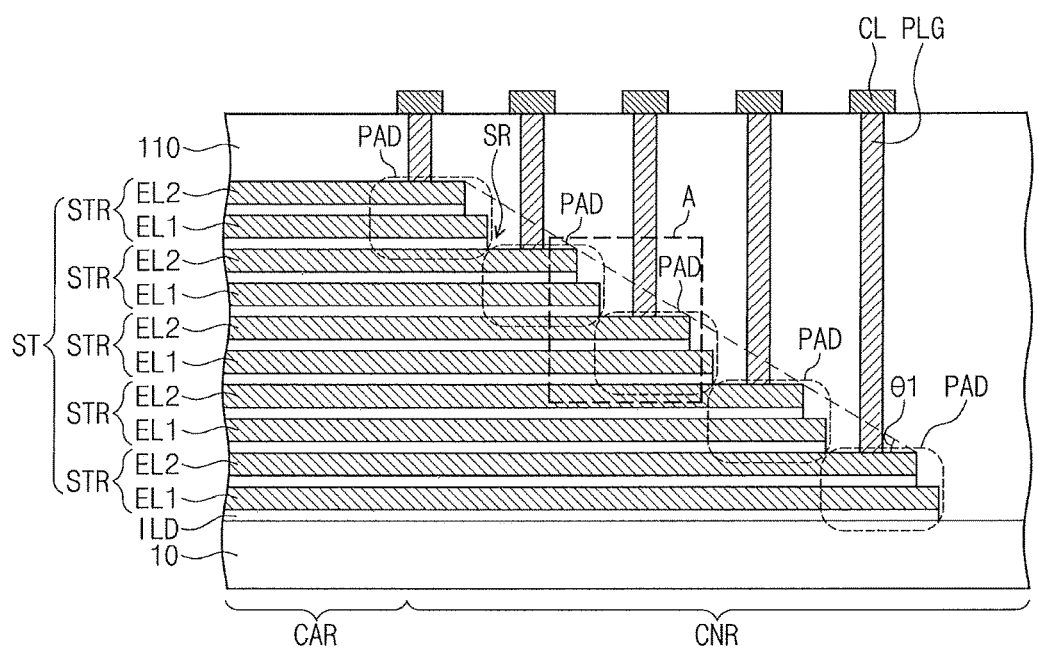
FIG. 1 is a cross-sectional view illustrating a three-dimensional (3D) semiconductor device according to some embodiments of the inventive concepts.
Figure 2:
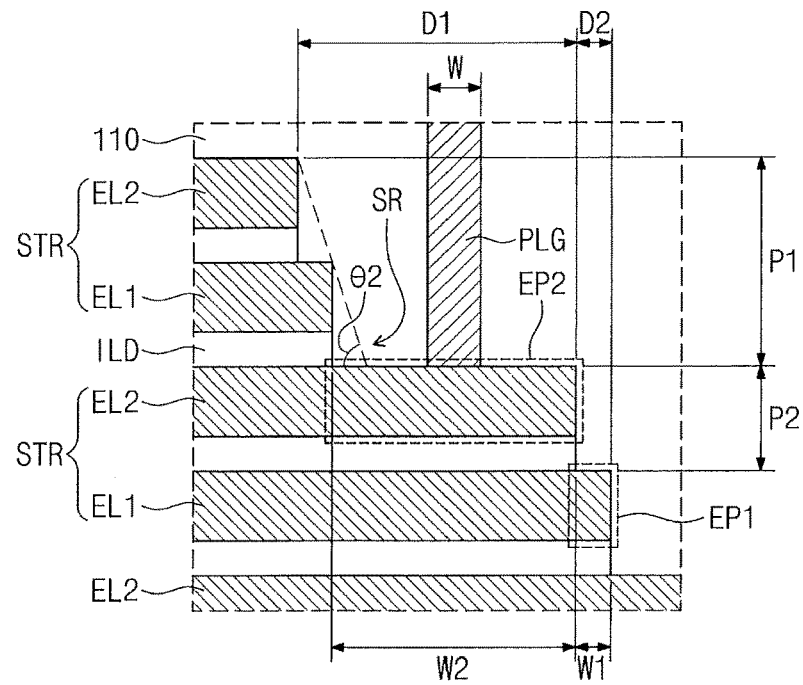
FIG. 2 is an enlarged view of a portion 'A' of FIG. 1.

FIG. 1 is a cross-sectional view illustrating a three-dimensional (3D) semiconductor device according to example embodiments of the inventive concepts. FIG. 2 is an enlarged view of a portion 'A' of FIG. 1.

An integrated circuit including a vertically stacked structure, such as a VNAND device, may include a cell array region CAR and connection region CNR. In example embodiments a stack structure ST includes plurality of stacks STR that extend from the cell array region CAR into the connection region CNR. Each subsequently higher stack STR (that is, "higher" in the sense that it is farther from the substrate 10 upon which the stack resides) extends a lesser distance into connection region CNR than the stack STR below it. Each stack STR includes a plurality of electrodes, with upper electrode(s) extending into connection region CNR a lesser distance than the electrode below it. For example, in an embodiment in which each stack STR includes two electrodes EL1 and EL2, an upper and a lower electrode, the upper electrode EL2 extends into the connection region less than the lower electrode EL1.

A line drawn along the intersections of the sidewalls and tops of the shortest of the electrodes in the different stacks within a stack structure forms an angle with the substrate that is different from (for example, less than) the angle between the substrate and a line drawn along the intersections of the sidewalls and tops of electrodes within a stack. For example, in an example embodiment in which each stack STR includes two electrodes (EL2 (upper) and EL1 (lower)), each of which may be viewed as tread (top surface) and riser (sidewall) of steps in the stack STR, and five stacks STR within a stack structure ST, a line drawn along the intersections of the sidewalls and tops of the shortest of the electrodes in the different stacks (EL2) within a stack structure ST forms an angle with the substrate that is different from (for example, less than) the angle between the substrate 10 (or the top electrode in the immediately lower stack) and a line drawn along the intersections of the sidewalls and tops of electrodes within a stack (that is, along the intersections of the sidewalls and tops of electrodes EL2 and EL1). The sidewalls of electrodes may be slanted at an angle with the substrate 10 in example embodiments.

The stacked structure ST may be viewed as two stepwise structures: a first stepwise structure defined by the "steps" of individual stacks within the stack structure (having the lesser angle associated with it) and a second stepwise structure defined by the "steps" of individual electrodes within individual stacks (having the greater angle associated with it).

A filling insulation layer 110 may be formed on the substrate 10 to cover the stack structure ST, with conductive lines CL formed on top. Contact plugs PLG may connect conductive lines CL to pads PAD disposed on, or constituted by, the uppermost of electrodes (for example, EL2) within each stack STR. In example embodiments in accordance with principles of inventive concepts, the second stepwise structure of individual stacks STR may effect better filling of the filling insulation layer 110, without voids (or air space).

In example embodiments, the distance D2 between the ends of electrodes within a stack STR may be less than the distance D1 between corresponding electrodes (EL2s, for example) within different stacks STR. The distance P1 between top and bottom electrodes within a stack STR may be greater than the distance P2 between, or thickness of, electrodes within a stack STR.

Referring to FIGS. 1 and 2, a substrate 10 may include a cell array region CAR and a connection region CNR. A stack structure ST may be disposed on the substrate 10 of the cell array region CAR and the connection region CNR and may extend in one direction away from the cell array region CAR. The stack structure ST may have a stepwise structure on the substrate 10 of the connection region CNR. In other words, a height of the stack structure ST of the connection region CNR may be reduced stepwise as a horizontal distance from the cell array region CAR into the connection region CNR increases. That is, in example embodiments the stack structure ST extends into the connection region CNR with the extension into the connection region CNR decreasing with each stack structure STR subsequently layered over a preceding stacks STR.

The stack structure ST may include a plurality of stacks STR vertically stacked on the substrate 10. Each of the stacks STR may include a plurality of electrodes EL1 and EL2 vertically stacked and insulating layers ILD disposed between the electrodes EL1 and EL2. The electrodes EL1 and EL2 may be formed of a conductive material (e.g., a doped semiconductor material or a metal). In some embodiments, each of the stacks STR may include a first electrode EL1, and a second electrode EL2 disposed on the first electrode EL1.

In example embodiments, each of the stacks STR may include a pad portion PAD in the connection region CNR. In example embodiments, end portions EP1 and EP2 of the first and second electrodes EL1 and EL2 of each of the stacks STR may constitute the pad portion PAD in the connection region CNR. In example embodiments, each of the first electrodes EL1 may have a first end portion EP1 exposed (that is, left uncovered) by the second electrode EL2 disposed thereon, and each of the second electrodes EL2 may have a second end portion EP2 exposed by the first electrode EL1 disposed thereon. Each of the pad portions PAD may include the first end portion EP1 of the first electrode EL1, and a second end portion EP2 the second electrode EL2. As illustrated in FIG. 2, the first end portion EP1 may have a first width W1, and the second end portion EP2 may have a second width W2. In example embodiments, the first width W1 may be less than half of the second width W2.

Lengths of the stacks STR may be sequentially reduced as a height from the substrate 10 increases. As a result, the pad portion PAD of the upper one of the stacks STR vertically adjacent to each other may expose the pad portion PAD of the lower one of the stacks STR vertically adjacent to each other. In other words, the pad portions PAD of the stacks STR may constitute the stepwise structure (that is, the "risers and treads") on the substrate 10 in the connection region CNR.

In other words, the stack structure ST including the plurality of stacks STR may include a plurality of the pad portions PAD that are disposed at positions vertically and horizontally different from each other in the connection region CNR. Ends of top surfaces of the pad portions PAD may be horizontally spaced apart from each other at equal distances. In example embodiments, each of the pad portions PAD may include the plurality of electrodes sequentially stacked.

In example embodiments, the ends of the top surfaces of the pad portions PAD of stack structure ST may be horizontally spaced apart from each other by a first distance D1, and the top surfaces of the pad portions PAD may be vertically spaced apart from each other by a first vertical pitch P1, as illustrated in FIG. 2. In example embodiments, the first vertical pitch P1 refers to a height difference between the top surfaces of the pad portions PAD vertically adjacent to each other. The first vertical pitch P1 may be changed according to the number of the electrodes included in each of the pad portions PAD. In some embodiments, the first vertical pitch P1 may be equal to or greater than twice a second vertical pitch P2 between a top surface of the first electrode EL1 and a top surface of the second electrode EL2.

In example embodiments, contact plugs PLG may be connected to the pad portions PAD of the stack structure ST, respectively. Each of the contact plugs PLG may be in contact with the uppermost electrode (e.g., the second electrode EL2) of each of the pad portions PAD. In each of the pad portions PAD, a sidewall of the lowermost electrode (e.g., the first electrode EL1) may be horizontally spaced apart from a sidewall of the uppermost electrode (e.g., the second electrode EL2). The sidewalls of the first and second electrodes EL1 and EL2 of each of the pad portions PAD may be disposed between the contact plugs PLG adjacent to each other.

In example embodiments, in each of the pad portions PAD, the second electrode EL2 corresponding to the uppermost electrode may be in contact with the contact plug PLG, and the sidewall of the first electrode EL1 corresponding to the lowermost electrode may be horizontally spaced apart from the sidewall of the second electrode EL2. As illustrated in FIG. 2, a second distance D2 corresponding to a horizontal distance between the sidewalls of the first and second electrodes EL1 and EL2 may be less than about a half of the first distance D1. In addition, the second distance D2 may be less than a width W of the contact plug PLG.

Due to the pad portions PAD, the stack structure ST may have a sidewall profile of a first stepwise structure. Because the sidewalls of the first and second electrodes EL1 and EL2 of each of the pad portions PAD are horizontally spaced apart from each other, each of the pad portions PAD may have a sidewall profile of a second stepwise structure. The first stepwise structure may have a first inclination angle $\theta 1$ with respect to a top surface of the substrate 10, and the first inclination angle $\theta 1$ may be smaller than 90 degrees. The second stepwise structure may have a second inclination angle $\theta 2$ with respect to the top surface of the substrate 10, and the second inclination angle $\theta 2$ may be greater than the first inclination angle $\theta 1$ and smaller than 90 degrees.

A filling insulation layer 110 may be disposed on the substrate 10 to cover the stack structure ST and may have a planarized top surface. Conductive lines CL may be disposed on the filling insulation layer 110 of the connection region CNR and may be connected to the contact plugs PLG, respectively.

Due to a height difference between the stack structure ST of the cell array region CAR and the stack structure ST of the connection region CNR, the filling insulation layer 110 may become progressively thicker as a horizontal distance from the cell array region CAR increases. The filling insulation layer 110 may fill spaces SR (hereinafter, referred to as "stepped regions SR"), each of which is defined between the pad portions PAD vertically adjacent to each other.

In example embodiments, as the height of the stack structure ST of the cell array region CAR (i.e., the number of the stacked electrodes EL1 and EL2) increases, the number of the electrodes EL1 and EL2 of each of the pad portions PAD may also increase. Because each of the pad portions PAD has the sidewall profile of the second stepwise structure having the second inclination angle $\theta 2$ by the electrodes EL1 and EL2 thereof, the filling insulation layer 110 may easily fill the stepped regions SR even though the first vertical pitch P1 of the pad portions PAD increases.

FIGS. 3 to 7 are cross-sectional views illustrating portions of stack structures of 3D semiconductor devices according to example embodiments of the inventive concepts. The descriptions to the same elements or technical features as in the embodiment of FIGS. 1 and 2 will be omitted or mentioned only briefly for the purpose of ease and convenience in explanation.

Referring to FIGS. 3 to 7, a stack structure ST may include a plurality of stacks STR vertically stacked, and each of the stacks STR may include a pad portion PAD disposed in the connection region CNR. Thus, the stack structure ST may include the pad portions PAD disposed at positions vertically and horizontally different from each other. In example embodiments, ends of top surfaces of the pad portions PAD vertically adjacent to each other may be horizontally spaced apart from each other by a first distance D1, and the top surfaces of the adjacent pad portions PAD may be vertically spaced apart from each other by a first vertical pitch P1.

In example embodiments, each of the stacks STR may include a plurality of electrodes EL1, EL2, EL3, and EL4 vertically stacked, and a second vertical pitch P2 of the electrodes EL1, EL2, EL3, and EL4 may be smaller than a half of the first vertical pitch P1. In some embodiments, each of the stacks STR may include first, second, third, and fourth electrodes ELL EL2, EL3, and EL4 sequentially stacked, and each of the pad portions PAD may include end portions of the first to fourth electrodes ELL EL2, EL3, and EL4. The first to fourth electrodes EL1, EL2, EL3, and EL4 may have substantially the same thickness and may be stacked at equal second vertical pitches P2. In each of the pad portions PAD, the fourth electrode EL4 corresponding to the uppermost electrode may be in contact with the contact plug PLG, and a sidewall of the first electrode EL1 corresponding to the lowermost electrode may be horizontally spaced apart from a sidewall of the fourth electrode EL4 by a second distance D2. In example embodiments, the second distance D2 may be less than about a half of the first distance D1.

This stack structure ST may have a first stepwise structure formed by the pad portions PAD and a second stepwise structure formed by the first to fourth electrodes EL1, EL2, EL3, and EL4 of each of the pad portions PAD. In example embodiments, the first stepwise structure may have a first inclination angle θ1 and the second stepwise structure may have a second inclination angle θ2, different from the first inclination angle θ1, as described with reference to FIGS. 1 and 2.

Figure 3:
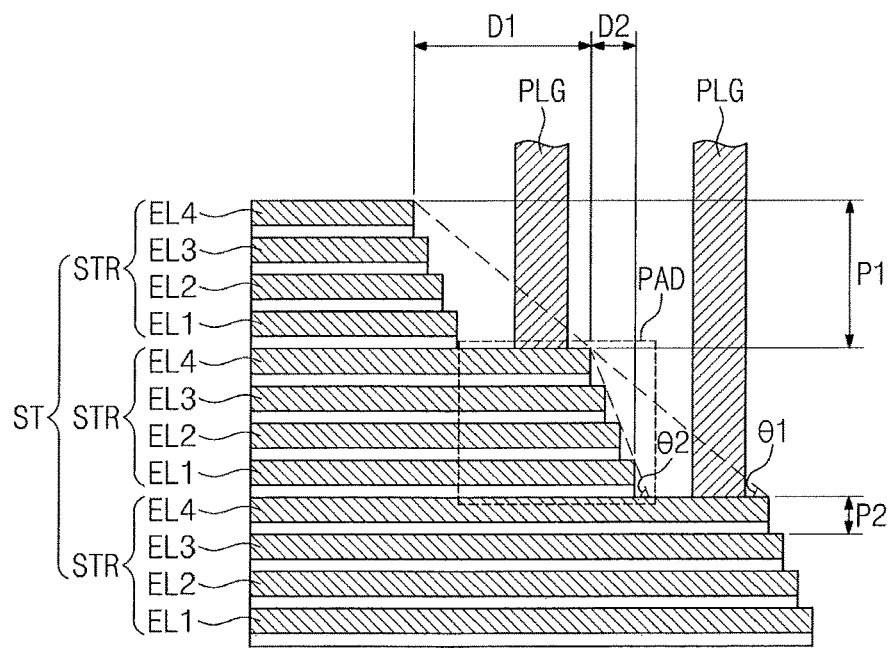
FIGS. 3 to 7 are cross-sectional views illustrating portions of 3D semiconductor devices according to some embodiments of the inventive concepts.
Figure 4:
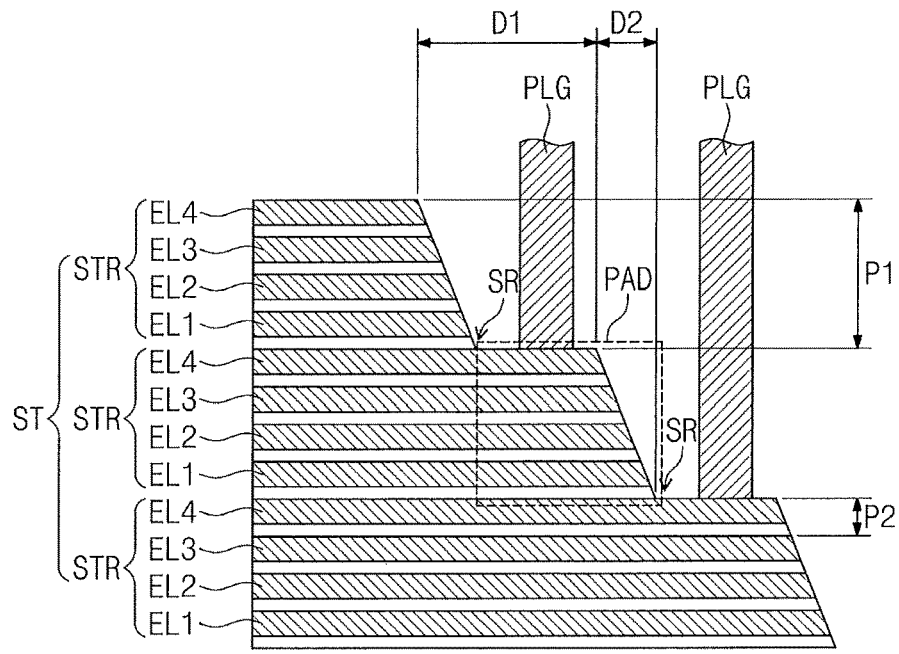

Referring to FIGS. 3 and 4, sidewalls of the second and third electrodes EL2 and EL3 may be horizontally spaced apart from each other between the sidewalls of the first and fourth electrodes EL1 and EL4. In example embodiments, the sidewalls of the first to fourth electrodes EL1, EL2, EL3, and EL4 may be substantially perpendicular to top surfaces of the first to fourth electrodes ELL EL2, EL3, and EL4. Alternatively, as illustrated in FIG. 4, the first to fourth electrodes ELL EL2, EL3, and EL4 may respectively have sidewalls inclined to the top surfaces of the first to fourth electrodes ELL EL2, EL3, and EL4.

Figure 5:
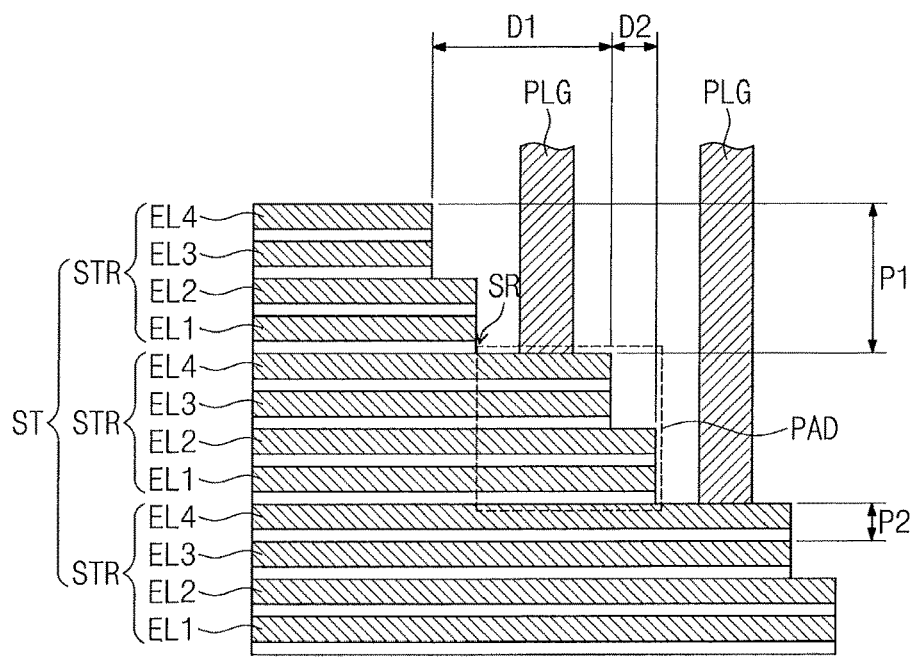

Referring to FIG. 5, a sidewall of the third electrode EL3 disposed under the uppermost fourth electrode EL4 may be aligned with the sidewall of the uppermost fourth electrode EL4. In addition, a sidewall of the second electrode EL2 disposed on the lowermost first electrode EL1 may be aligned with the sidewall of the lowermost first electrode EL1.

Figure 6:
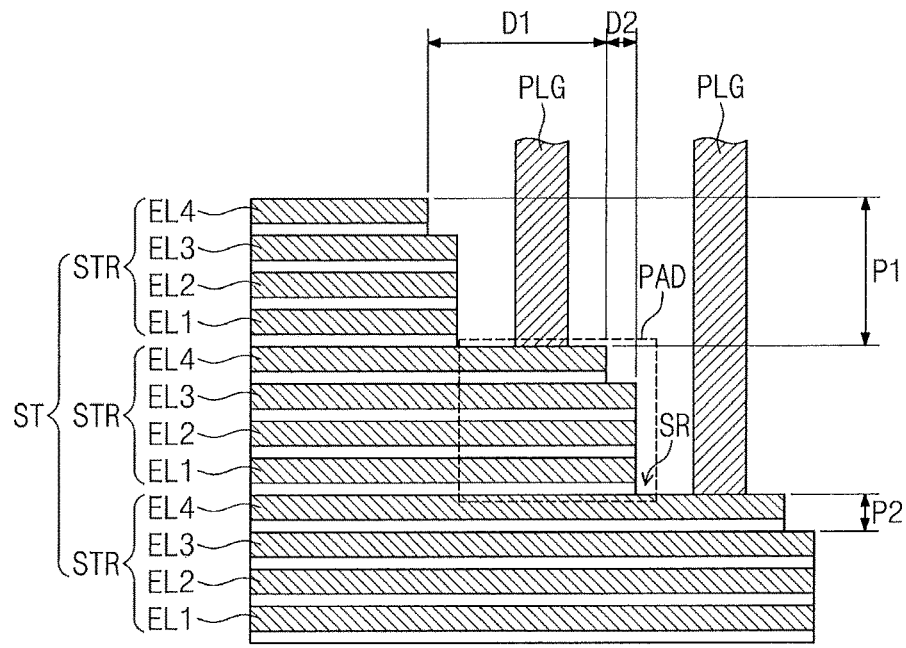
Figure 7:
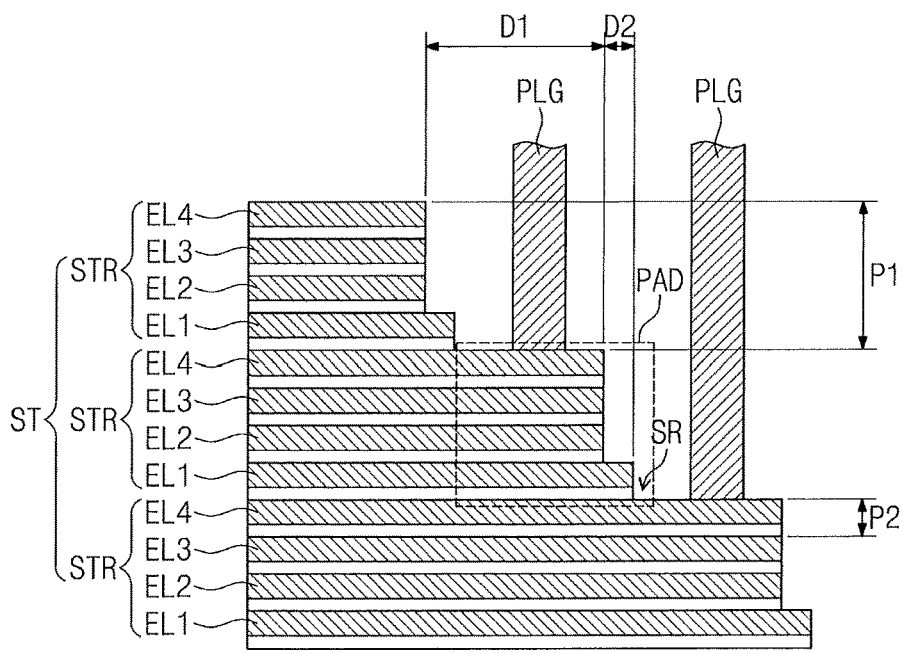

In example embodiments, as illustrated in FIG. 6, sidewalls of the second and third electrodes EL2 and EL3 may be aligned with the sidewall of the lowermost first electrode EL1. In other example embodiments, as illustrated in FIG. 7, sidewalls of the second and third electrodes EL2 and EL3 may be aligned with the sidewall of the uppermost fourth electrode EL4.

Figure 8:
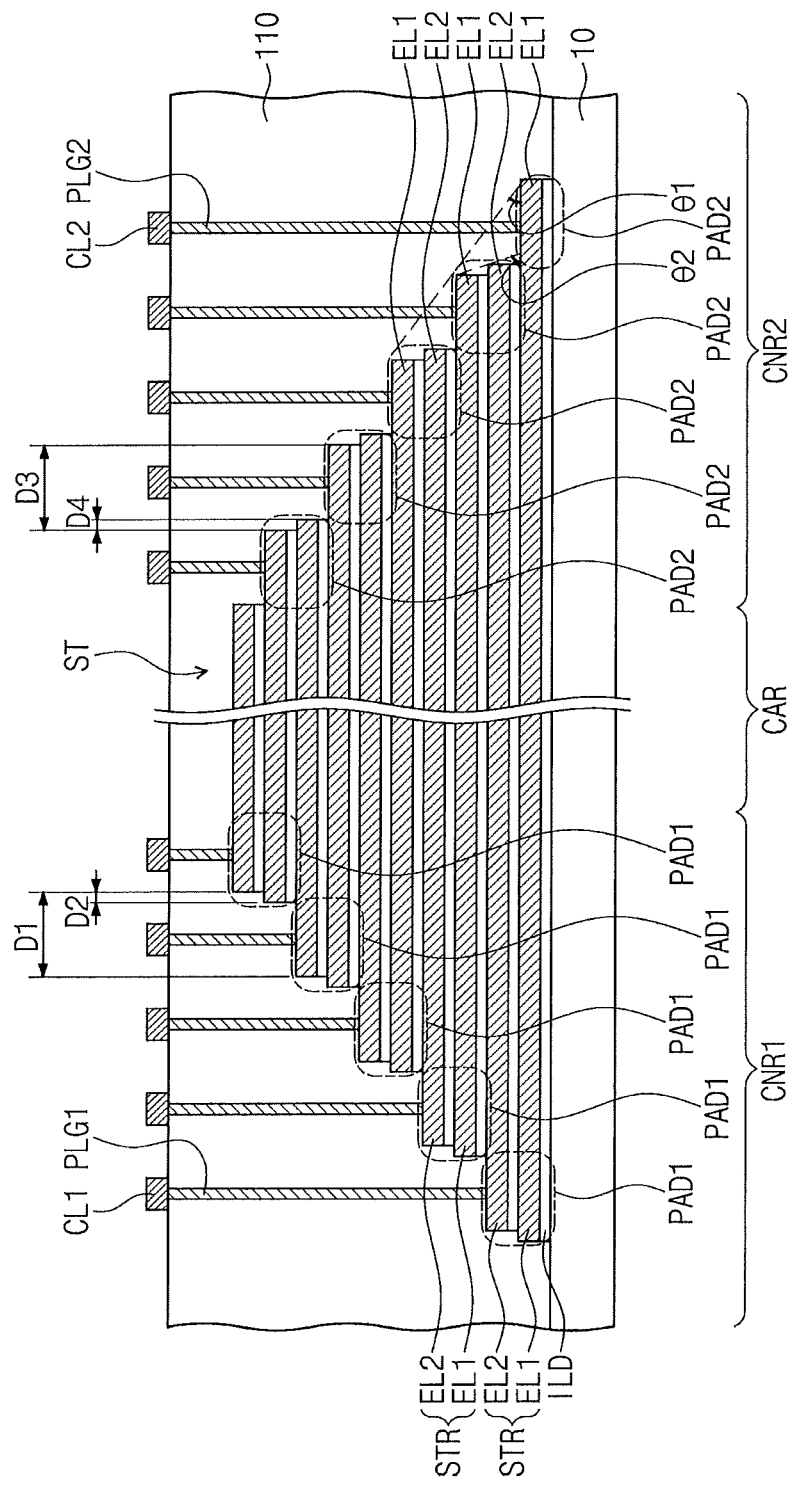
FIG. 8 is a cross-sectional view illustrating a 3D semiconductor device according to some embodiments of the inventive concepts.

FIG. 8 is a cross-sectional view illustrating a 3D semiconductor device according to example embodiments of the inventive concepts.

Referring to FIG. 8, a substrate 10 may include a first connection region CNR1, a second connection region CNR2, and a cell array region CAR disposed between the first and second connection regions CNR1 and CNR2. A stack structure ST may be disposed on the substrate 10. The stack structure ST may include a plurality of stacks STR vertically stacked on the substrate 10. The stack structure ST may extend from the cell array region CAR into the first and second connection regions CNR1 and CNR2 and may have stepwise structures in the first and second connection regions CNR1 and CNR2. In other words, lengths of the stacks STR may sequentially decrease as a vertical distance from the substrate 10 increases.

In example embodiments, each of the stacks STR may include electrodes EL1 and EL2 vertically stacked and insulating layers ILD disposed between the electrodes EL1 and EL2. In example embodiments, each of the stacks STR may include first and second electrodes EL1 and EL2 and the insulating layer ILD disposed between the first and second electrodes EL1 and EL2. In other words, the stack structure ST including the plurality of stacks STR may include the first electrodes EL1 and the second electrodes EL2, which are alternately and repeatedly stacked. Each of the first electrodes EL1 may have first end portions respectively disposed in the first and second connection regions CNR1 and CNR2, and each of the second electrodes EL2 may have second end portions respectively disposed in the first and second connection regions CNR1 and CNR2.

According to some example embodiments of the inventive concepts, the stack structure ST may include first pad portions PAD1 that are disposed at positions vertically different from each other in the first connection region CNR1. Ends of top surfaces of the first pad portions PAD1 may be horizontally spaced apart from each other at equal distances. In addition, the stack structure ST may include second pad portions PAD2 that are disposed at positions vertically different from each other in the second connection region CNR2. Ends of top surfaces of the second pad portions PAD2 may be horizontally spaced apart from each other at equal distances.

In example embodiments, each of the first and second pad portions PAD1 and PAD2 may include the end portions of the first and second electrodes EL1 and EL2, which are stacked. In detail, each of the first pad portions PAD1 may include the first end portion of the first electrode EL1 and the second end portion of the second electrode EL2 disposed on the first electrode EL1, which are disposed in the first connection region CNR1. Each of the second pad portions PAD2 may include the second end portion of the second electrode EL2 and the first end portion of the first electrode EL1 disposed on the second electrode EL2, which are disposed in the second connection region CNR2.

In example embodiments, the ends of the top surfaces of the first pad portions PAD1 adjacent to each other may be horizontally spaced apart from each other by a first distance D1 in the first connection region CNR1. The top surfaces of the first pad portions PAD1 adjacent to each other may be vertically spaced apart from each other by a first vertical pitch (P1 of FIG. 2) in the first connection region CNR1. The first vertical pitch P1 may be equal to or greater than twice a vertical pitch (P2 of FIG. 2) of the first and second electrodes EL1 and EL2. Likewise, the ends of the top surfaces of the second pad portions PAD2 adjacent to each other may be horizontally spaced apart from each other by a third distance D3 in the second connection region CNR2. The top surfaces of the second pad portions PAD2 adjacent to each other may be vertically spaced apart from each other by the first vertical pitch (P1 of FIG. 1) in the second connection region CNR2. In some embodiments, the third distance D3 may be equal to the first distance D1. Alternatively, the third distance D3 may be different from the first distance D1. In addition, the second pad portions PAD2 may be disposed at different levels from the first pad portions PAD1. Vertical thicknesses of the first pad portions PAD1 may be substantially equal to each other. The vertical thickness of at least one of the second pad portions PAD2 may be different from vertical thicknesses of others of the second pad portions PAD2. For example, the vertical thickness of the lowermost one of the second pad portions PAD2 may be smaller than those of others of the second pad portions PAD2.

In example embodiments, first contact plugs PLG1 may be connected to the second electrodes EL2 of the first pad portions PAD1, respectively, and second contact plugs PLG2 may be connected to the first electrodes EL1 of the second pad portions PAD2, respectively.

In the first connection region CNR1, the ends of the top surfaces of the first pad portions PAD1 may be horizontally spaced apart from each other by the first distance D1 as described above. In example embodiments, the first distance D1 may be substantially equal to a horizontal distance between sidewalls of the first electrodes EL1 adjacent to each other and a horizontal distance between sidewalls of the second electrodes EL2 adjacent to each other in the first connection region CNR1.

In each of the first pad portions PAD1, the sidewall of the second electrode EL2 and the sidewall of the first electrode EL1 may be disposed at positions horizontally different from each other, and the sidewall of the second electrode EL2 may be horizontally spaced apart from the sidewall of the first electrode EL1 by a second distance D2. In example embodiments, the second distance D2 may be less than a half of the first distance D1 corresponding to a horizontal distance between the ends of the top surfaces of the first pad portions PAD1 adjacent to each other. In addition, the second distance D2 may be less than the width of the first contact plug PLG1. The sidewalls of the first and second electrodes EL1 and EL2 of each of the first pad portions PAD1 may be disposed between the first contact plugs PLG1 adjacent to each other.

In the second connection region CNR2, the ends of the top surfaces of the second pad portions PAD2 may be horizontally spaced apart from each other by the third distance D3 as described above. In example embodiments, the third distance D3 may be substantially equal to a horizontal distance between sidewalls of the first electrodes EL1 adjacent to each other and a horizontal distance between sidewalls of the second electrodes EL2 adjacent to each other in the second connection region CNR2.

In each of the second pad portions PAD2, the sidewall of the first electrode EL1 and the sidewall of the second electrode EL2 may be disposed at positions horizontally different from each other, and the sidewall of the second electrode EL2 may be horizontally spaced apart from the sidewall of the first electrode EL1 by a fourth distance D4. In example embodiments, the fourth distance D4 may be less than a half of the third distance D3 corresponding to a horizontal distance between the ends of the top surfaces of the second pad portions PAD2 adjacent to each other. In addition, the fourth distance D4 may be less than a width of the second contact plug PLG2. In example embodiments, the fourth distance D4 may be substantially equal to the second distance D2. Alternatively, the fourth distance D4 may be different from the second distance D2. The sidewalls of the first and second electrodes EL1 and EL2 of each of the second pad portions PAD2 may be disposed between the second contact plugs PLG2 adjacent to each other.

The stack structure ST may have a first stepwise structure realized by the first pad portions PAD1 in the first connection region CNR1, and each of the first pad portions PAD1 may have a second stepwise structure realized by the first and second electrodes EL1 and EL2 included therein. The first stepwise structure may have a first inclination angle $\theta 1$ with respect to a top surface of the substrate 10, and the first inclination angle $\theta 1$ may be smaller than 90 degrees. The second stepwise structure may have a second inclination angle $\theta 2$ with respect to the top surface of the substrate 10, and the second inclination angle $\theta 2$ may be greater than the first inclination angle $\theta 1$ and smaller than 90 degrees. The stack structure ST may also include the first and second stepwise structures in the second connection region CNR2.

A filling insulation layer 110 may be disposed on an entire top surface of the substrate 10 to cover the stack structure ST and may have a planarized top surface. First conductive lines CL1 may be disposed on the filling insulation layer 110 of the first connection region CNR1 so as to be connected to the first contact plugs PLG1, respectively, and second conductive lines CL2 may be disposed on the filling insulation layer 110 of the second connection region CNR2 so as to be connected to the second contact plugs PLG2, respectively.

Figure 9:
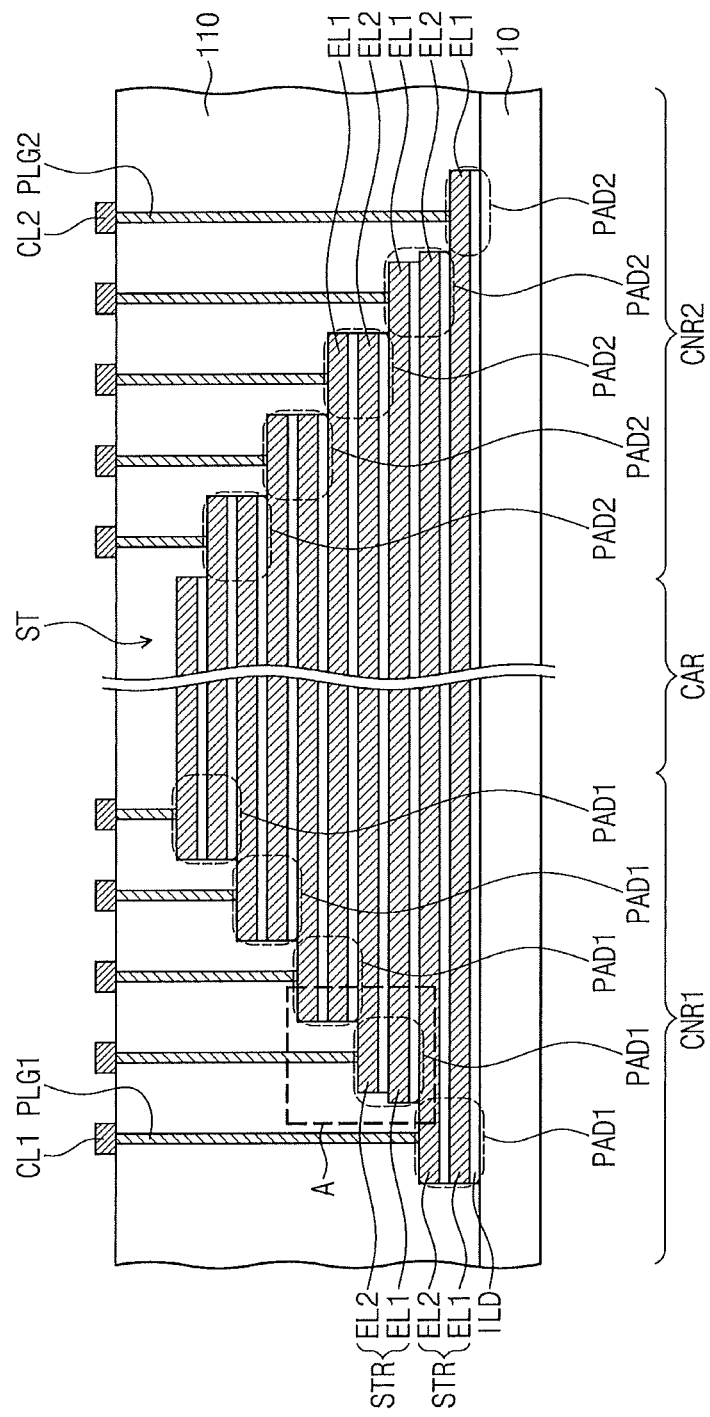
FIG. 9 is a cross-sectional view illustrating a 3D semiconductor device according to some embodiments of the inventive concepts.
Figure 10:
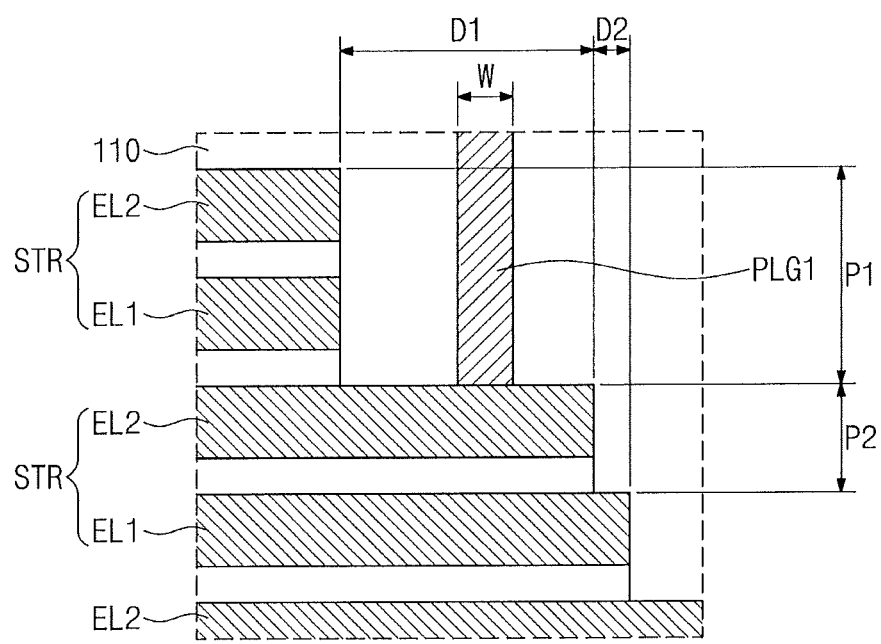
FIG. 10 is an enlarged view of a portion 'A' of FIG. 9.

FIG. 9 is a cross-sectional view illustrating a 3D semiconductor device according to example embodiments of the inventive concepts. FIG. 10 is an enlarged view of a portion 'A' of FIG. 9. In the embodiment of FIGS. 9 and 10, the descriptions of the same elements or technical features as in the embodiment of FIG. 8 will be omitted or only mentioned briefly for the purpose of ease and convenience in explanation.

Referring to FIG. 9, a stack structure ST may include a plurality of stacks STR vertically stacked, and each of the stacks STR may include first and second electrodes EL1 and EL2 vertically stacked.

The stack structure ST may include first pad portions PAD1 that are disposed at positions horizontally and vertically different from each other in a first connection region CNR1. In addition, the stack structure ST may include second pad portions PAD2 that are disposed at positions horizontally and vertically different from each other in a second connection region CNR2.

In example embodiments, ends of top surfaces of the first pad portions PAD1 of stack structure ST may be horizontally spaced apart from each other by a first distance D1, and the top surfaces of the first pad portions PAD1 may be vertically spaced apart from each other by a first vertical pitch P1, as illustrated in FIG. 10. Here, the first vertical pitch P1 may be equal to or greater than about twice a height difference P2 (or a second vertical pitch P2) of the first and second electrodes EL1 and EL2. Likewise, ends of top surfaces of the second pad portions PAD2 may be horizontally spaced apart from each other by a third distance in the second connection region CNR2. The top surfaces of the second pad portions PAD2 may be vertically spaced apart from each other by the first vertical pitch P1 in the second connection region CNR2.

In example embodiments, first contact plugs PLG1 may be connected to the second electrodes EL2 of the first pad portions PAD1, respectively, and second contact plugs PLG2 may be connected to the first electrodes EL1 of the second pad portions PAD2, respectively.

In example embodiments, in at least one of the first pad portions EL1, sidewalls of the first and second electrodes EL1 and EL2 may be aligned with each other. In addition, in at least another of the first pad portions PAD1, a sidewall of the second electrode EL2 and a sidewall of the first electrode EL1 may be disposed at positions vertically and horizontally different from each other. In example embodiments, a second distance D2 corresponding to a horizontal distance between the sidewalls of the first and second electrodes EL1 and EL2 may be less than a half of the first distance D1 corresponding to the horizontal distance between the ends of the top surfaces of the first pad portions PAD1. Likewise, sidewalls of the first and second electrodes EL1 and EL2 of at least one of the second pad portions PAD2 may be aligned with each other, and sidewalls of the first and second electrodes EL1 and EL2 of at least another of the second pad portions PAD2 may be disposed at positions vertically and horizontally different from each other.

The sidewalls of the first and second electrodes EL1 and EL2 of each of the first pad portions PAD1 may be disposed between the first contact plugs PLG1 adjacent to each other, and the sidewalls of the first and second electrodes EL1 and EL2 of each of the second pad portions PAD2 may be disposed between the second contact plugs PLG2 adjacent to each other.

According to the present example embodiment, the stack structure ST may have the first stepwise structure realized by the first pad portions PAD1 in the first connection region CNR1, and at least one of the first pad portions PAD1 may have the second stepwise structure realized by the first and second electrodes EL1 and EL2 vertically adjacent to each other. The first and second stepwise structures may also be provided in the second connection region CNR2.

Figure 11:
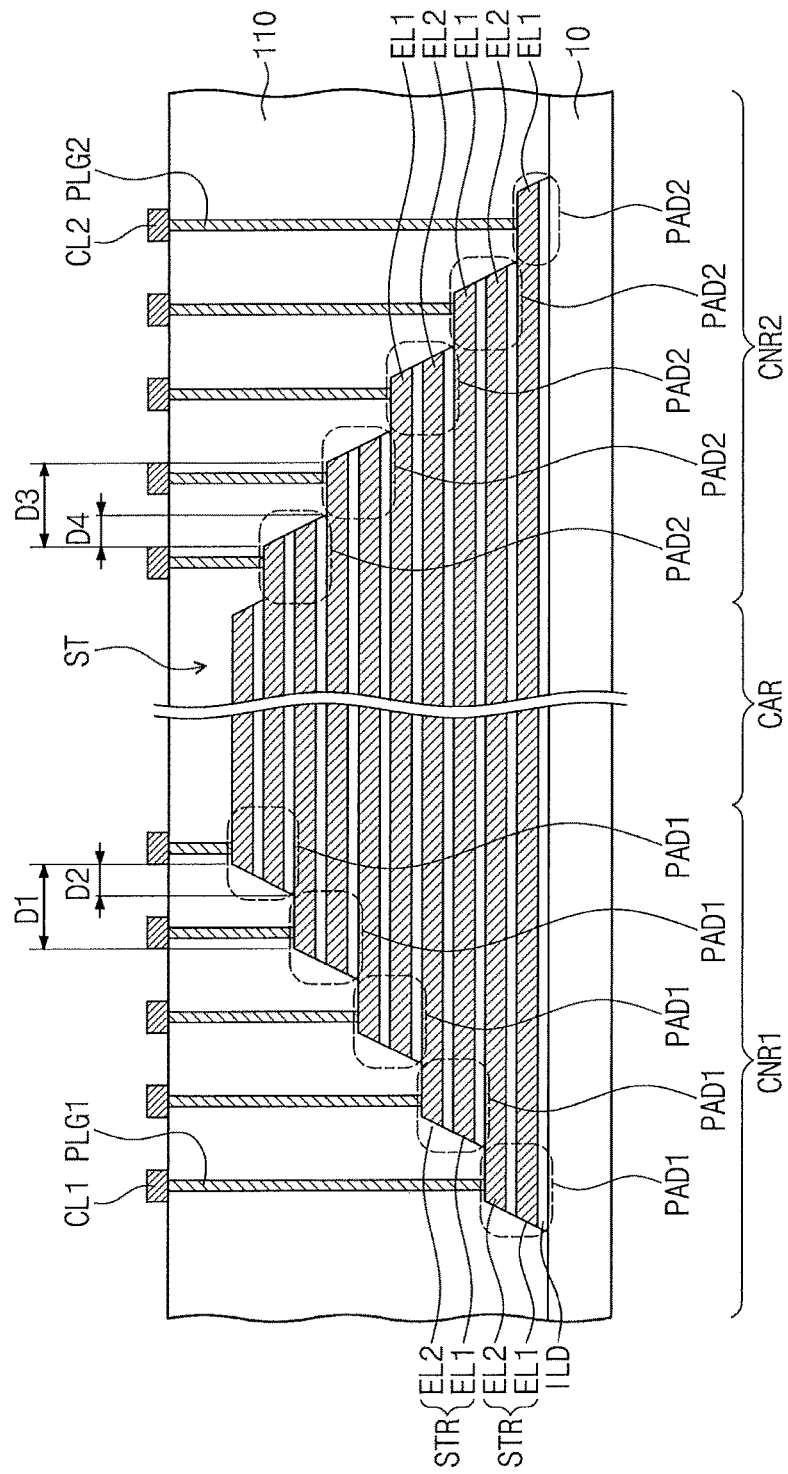
FIG. 11 is a cross-sectional view illustrating a 3D semiconductor device according to some embodiments of the inventive concepts.

FIG. 11 is a cross-sectional view illustrating a 3D semiconductor device according to example embodiments of the inventive concepts. In the present example embodiment, the descriptions of the same elements or technical features as in the embodiment of FIG. 8 will be omitted or only mentioned briefly for the purpose of ease and convenience in explanation.

Referring to FIG. 11, as described above, the stack structure ST may include first pad portions PAD1 of the first connection region CNR1 and second pad portions PAD2 of the second connection region CNR2. As described above, the first pad portions PAD1 may be disposed at positions horizontally and vertically different from each other in the first connection region CNR1, and the second pad portions PAD2 may be disposed at positions horizontally and vertically different from each other in the second connection region CNR2.

Each of the first and second pad portions PAD1 and PAD2 may include first and second electrodes EL1 and EL2 vertically adjacent to each other, and the first and second electrodes EL1 and EL2 may have sidewalls inclined to top surfaces of the first and second electrodes EL1 and EL2. In other words, each of the first and second pad portions PAD1 and PAD2 may have an inclined sidewall profile.

In example embodiments, the stack structure ST may have a first stepwise structure realized by the first pad portions PAD1 in the first connection region CNR1, and each of the first pad portions PAD1 may have the inclined sidewall profile. Likewise, the stack structure ST may have the first stepwise structure realized by the second pad portions PAD2 in the second connection region CNR2, and each of the second pad portions PAD2 may have the inclined sidewall profile. In example embodiments, the first stepwise structure may have a first inclination angle (see $\theta 1$ of FIG. 3) smaller than 90 degrees with respect to the top surface of the substrate 10, and the sidewall of each of the pad portions PAD1 and PAD2 may have a second inclination angle (see $\theta 2$ of FIG. 3) that is greater than the first inclination angle (see $\theta 1$ of FIG. 3) and smaller than 90 degrees.

Figure 12:
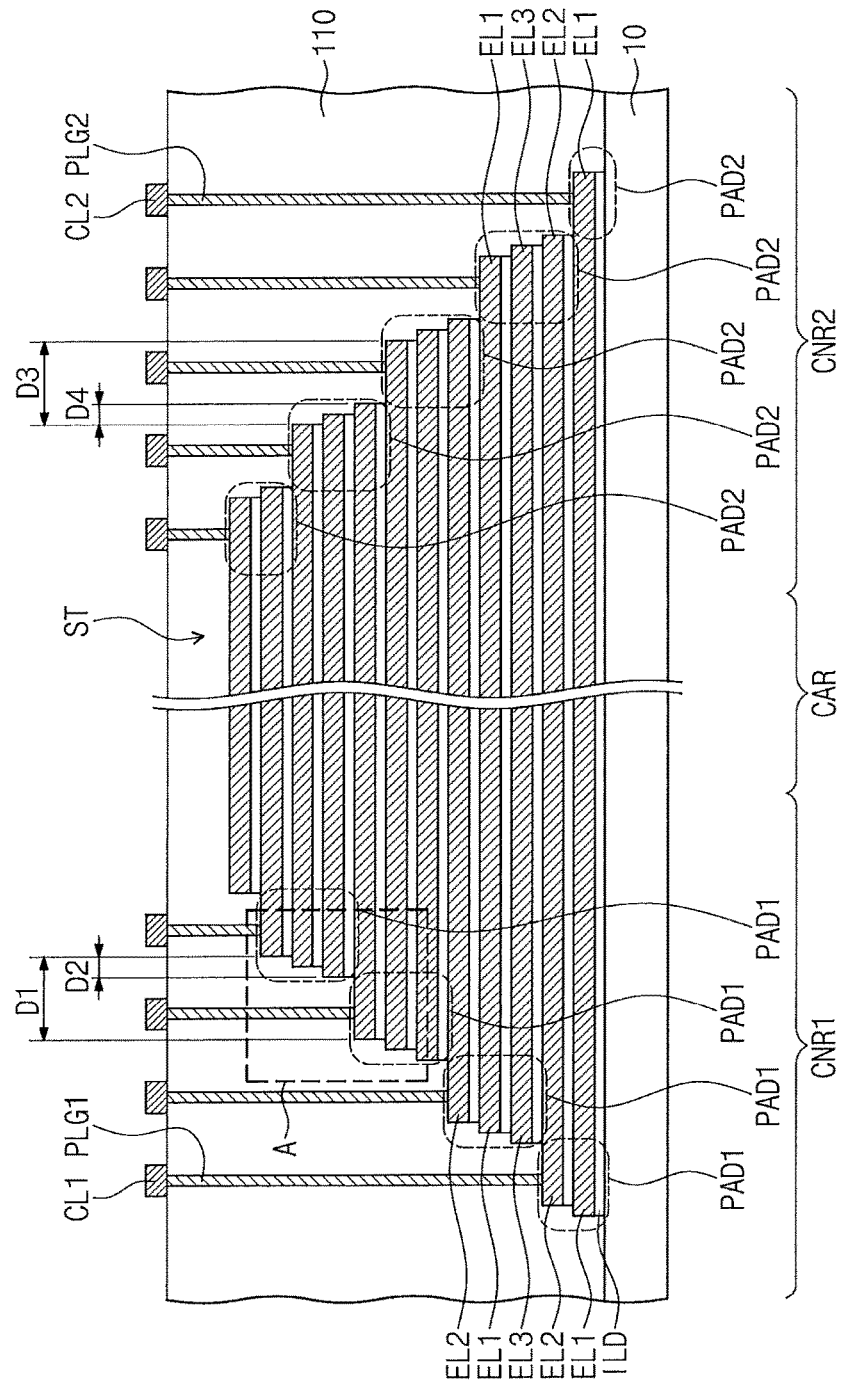
FIG. 12 is a cross-sectional view illustrating a 3D semiconductor device according to some embodiments of the inventive concepts.
Figure 13:
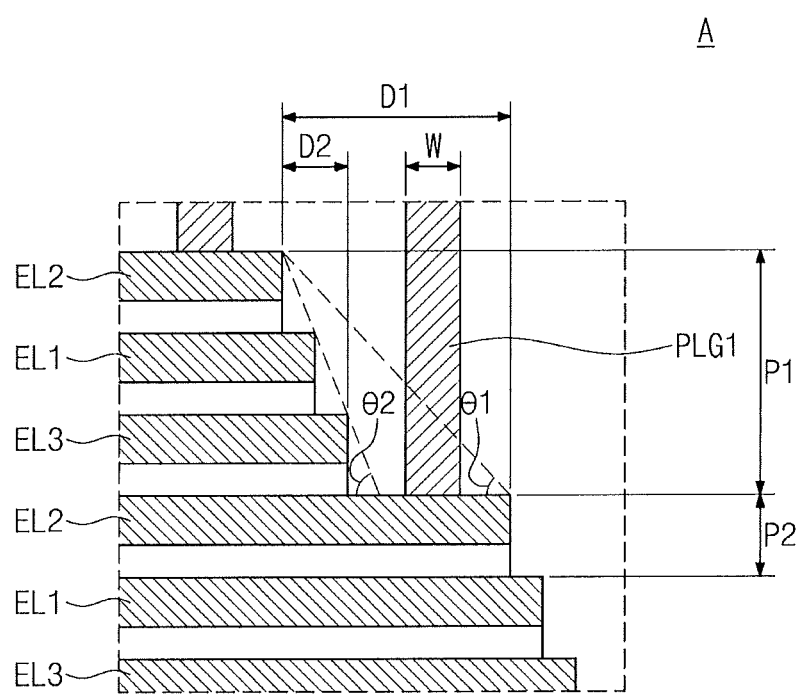
FIG. 13 is an enlarged view of a portion 'A' of FIG. 12.

FIG. 12 is a cross-sectional view illustrating a 3D semiconductor device according to example embodiments of the inventive concepts, and FIG. 13 is an enlarged view of a portion 'A' of FIG. 12. In the present example embodiment, the descriptions of the same elements or technical features as in the embodiment of FIG. 8 will be omitted or mentioned only briefly for the purpose of ease and convenience in explanation.

Referring to FIGS. 12 and 13, a stack structure ST may be disposed on a substrate 10 including first and second connection regions CNR1 and CNR2 and a cell array region CAR disposed between the first and second connection regions CNR1 and CNR2. The stack structure ST may include a plurality of stacks STR stacked on the substrate 10, and lengths of the stacks STR may be sequentially reduced as a distance from the substrate 10 increases. In example embodiments, each of the stacks STR may include a first electrode EL1, a second electrode EL2, and a third electrode EL3 which are sequentially stacked. Each of the first to third electrodes EL1, EL2, and EL3 may have end portions respectively disposed in the first and second connection regions CNR1 and CNR2.

The stack structure ST may include first pad portions PAD1 which are disposed at positions horizontally and vertically different from each other in a first connection region CNR1. In addition, the stack structure ST may also include second pad portions PAD2 which are disposed at positions horizontally and vertically different from each other in a second connection region CNR2. The stack structure ST may have stepwise sidewall profiles by the first and second pad portions PAD1 and PAD2 in the first and second connection regions CNR1 and CNR2.

In the first connection region CNR1, ends of top surfaces of the first pad portions PAD1 adjacent to each other may be horizontally spaced apart from each other by a first distance D1 and may be disposed at levels different from each other based on a top surface of the substrate 10. Likewise, in the second connection region CNR2, ends of top surfaces of the second pad portions PAD2 adjacent to each other may be horizontally spaced apart from each other by a third distance D3 and may be disposed at levels different from each other based on the top surface of the substrate 10. The first pad portions PAD1 may be disposed at different levels from the second pad portions PAD2 based on the top surface of the substrate 10.

In example embodiments, at least one of the first pad portions PAD1 may have the end portions of the first to third electrodes EL1, EL2, and EL3 vertically adjacent to each other, and at least one of the second pad portions PAD2 may have the end portions of the first to third electrodes EL1, EL2, and EL3 vertically adjacent to each other. The lowermost one of the first pad portions PAD1 may have the end portions of the first and second electrodes EL1 and EL2 vertically stacked. The lowermost one of the second pad portions PAD2 may have the end portion of the lowermost first electrode EL1 of the stack structure ST.

In example embodiments, in each of the first pad portions PAD1, the uppermost electrode may be in contact with the first contact plug PLG1 and a sidewall of the lowermost electrode may be horizontally spaced apart from a sidewall of the uppermost electrode. In example embodiments, a second distance D2 corresponding to a horizontal distance between the sidewalls of the uppermost and lowermost electrodes may be less than about a half of the first distance D1 corresponding to the horizontal distance between the ends of the top surfaces of the first pad portions PAD1.

In example embodiments, in at least one of the first pad portions PAD1, the second electrode EL2 may correspond to the uppermost electrode, the third electrode EL3 may correspond to the lowermost electrode, and the first electrode EL1 may be disposed between the second and third electrodes EL2 and EL3. In example embodiments, the end portion of the first electrode EL1 may be exposed by the second electrode EL2, and the end portion of the third electrode EL3 may be exposed by the first electrode EL1.

The end portion of the second electrode EL2 corresponding to the uppermost electrode may be in contact with the first contact plug PLG1. The second distance D2 corresponding to a horizontal distance between the sidewall of the lowermost third electrode EL3 and the sidewall of the uppermost second electrode EL2 may be less than a half of the first distance D1 corresponding to the horizontal distance between the ends of the top surfaces of the first pad portions PAD1. The sidewall of the first electrode EL1 disposed between the second and third electrodes EL2 and EL3 may be horizontally spaced apart from the sidewalls of the second and third electrodes EL2 and EL3.

In example embodiments, in each of the second pad portions PAD2, the uppermost electrode may be in contact with the second contact plug PLG2 and a sidewall of the lowermost electrode may be horizontally spaced apart from a sidewall of the uppermost electrode. In example embodiments, a fourth distance D4 corresponding to a horizontal distance between the sidewalls of the uppermost and lowermost electrodes of each of the second pad portions PAD2 may be less than about a half of the third distance D3.

In example embodiments, in at least one of the second pad portions PAD2, the first electrode EL1 may correspond to the uppermost electrode and the second electrode EL2 may correspond to the lowermost electrode. In addition, the third electrode EL3 may be disposed between the first and second electrodes EL1 and EL2 in at last one of the second pad portions PAD2. In example embodiments, the end portion of the third electrode EL3 may be exposed by the first electrode EL1, and the end portion of the second electrode EL2 may be exposed by the third electrode EL3.

The second contact plug PLG2 may be connected to the first electrode EL1 corresponding to the uppermost electrode. The fourth distance D4 between the sidewalls of the uppermost second electrode EL1 and the lowermost second electrode EL2 may be less than a half of the third distance D3. In addition, the fourth distance D4 may be less than a width of the second contact plug PLG2. The sidewall of the third electrode EL3 disposed between the first and second electrodes EL1 and EL2 may be horizontally spaced apart from the sidewalls of the first and second electrodes EL1 and EL2.

The stack structure ST may have a first stepwise structure realized by the first pad portions PAD1 in the first connection region CNR1, and each of the first pad portions PAD1 may have a second stepwise structure realized by the first to third electrodes EL1, EL2, and EL3 vertically adjacent to each other. The first stepwise structure may have a first inclination angle θ1 smaller than 90 degrees with respect to the top surface of the substrate 10, and the second stepwise structure may have a second inclination angle θ2 which is greater than the first inclination angle θ1 and smaller than 90 degrees. The stack structure ST may also include the first and second stepwise structures in the second connection region CNR2.

When the filling insulation layer 110 is deposited in the stepped region between the first pad portions PAD1 vertically adjacent to each other, the stepped region may be easily filled with the filling insulation layer 110 due to the second stepwise structures of the first pad portions PAD1.

Figure 14:
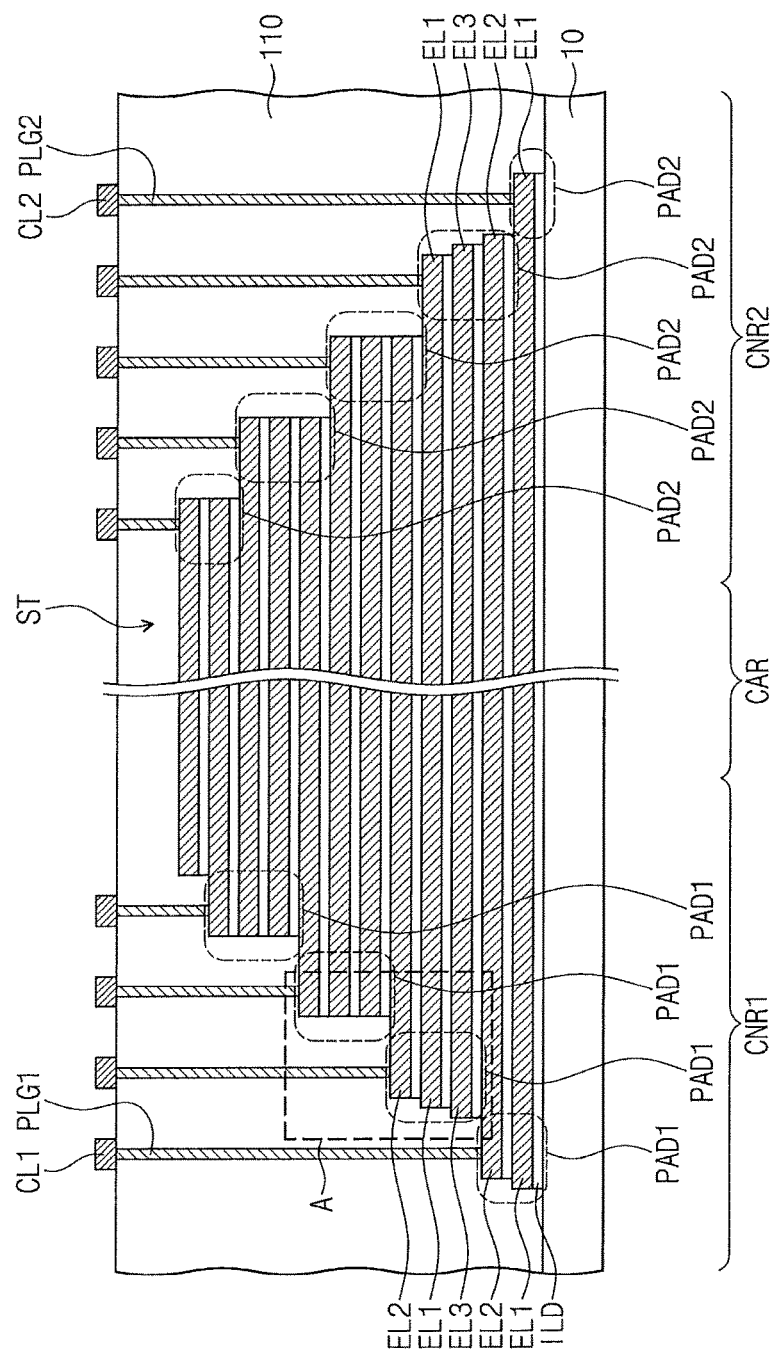
FIG. 14 is a cross-sectional view illustrating a 3D semiconductor device according to some embodiments of the inventive concepts.
Figure 15:
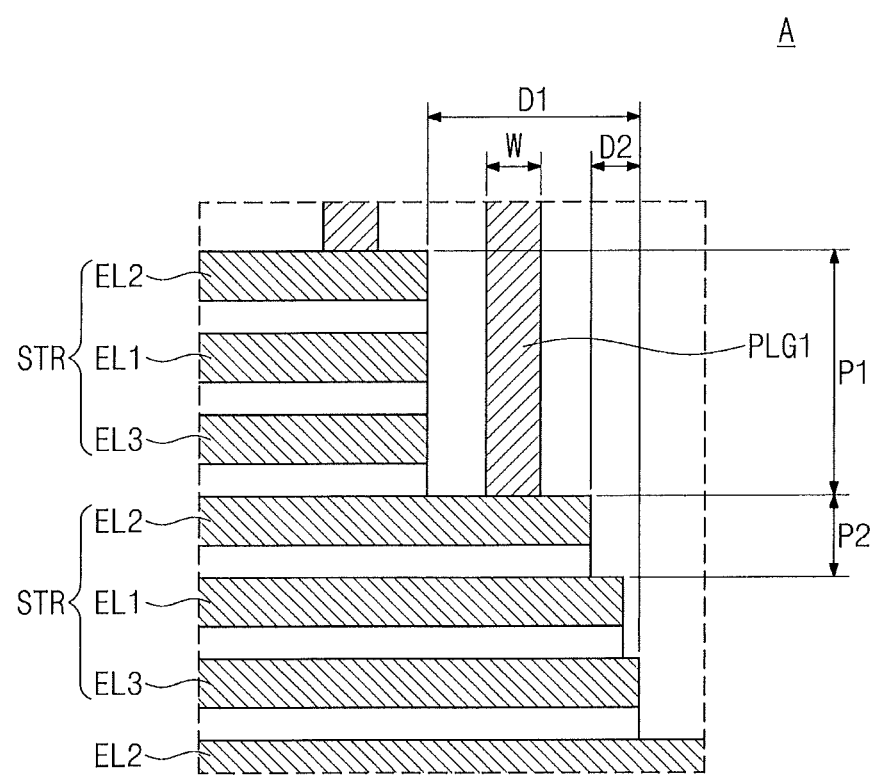
FIG. 15 is an enlarged view of a portion 'A' of FIG. 14.

FIG. 14 is a cross-sectional view illustrating a 3D semiconductor device according to example embodiments of the inventive concepts, and FIG. 15 is an enlarged view of a portion 'A' of FIG. 14. In the present example embodiment, the descriptions of the same elements or technical features as in the embodiment of FIGS. 12 and 13 will be omitted or mentioned only briefly for the purpose of ease and convenience in explanation.

Referring to FIGS. 14 and 15, a stack structure ST may include a plurality of stacks STR stacked on a substrate 10, and each of the stacks STR may include a first electrode EL1, a second electrode EL2, and a third electrode EL3 which are sequentially stacked.

First pad portions PAD1 of the stack structure ST may be disposed on the substrate 10 of the first connection region CNR1, and second pad portions PAD2 of the stack structure ST may be disposed on the substrate 10 of the second connection region CNR2. As described above, each of the first and second pad portions PAD1 and PAD2 may include end portions of the first to third electrodes EL1 to EL3 vertically adjacent to each other.

In example embodiments, in at least one of the first pad portions PAD1, the second electrode EL2 may correspond to the uppermost electrode and the third electrode EL3 may correspond to the lowermost electrode. In addition, the first electrode EL1 may be disposed between the second and third electrodes EL2 and EL3 in the at last one of the first pad portions PAD1. In at least one of the second pad portions PAD2, the first electrode EL1 may correspond to the uppermost electrode and the second electrode EL2 may correspond to the lowermost electrode. In addition, the third electrode EL3 may be disposed between the first and second electrodes EL1 and EL2 in the at last one of the second pad portions PAD2.

In these example embodiments, first contact plugs PlG1 may be connected to the second electrodes EL2 of the first pad portions PAD1 in first connection region CNR1, respectively, and second contact plugs PlG2 may be connected to the first electrodes EL1 of the second pad portions PAD2 in the second connection region CNR2, respectively.

In addition, in at least one of the first pad portions PAD1, a sidewall of the second electrode EL2 corresponding to the uppermost electrode may be horizontally spaced apart from a sidewall of the third electrode EL3 corresponding to the lowermost electrode. In example embodiments, the second distance D2 between the sidewalls of the second and third electrodes EL2 and EL3 may be less than a half of the first distance D1 In addition, the sidewall of the first electrode EL1 disposed between the second and third electrodes EL2 and EL3 may be disposed between the sidewalls of the second and third electrodes EL2 and EL3 when viewed from a plan view.

In example embodiments, in another of the first pad portions PAD, sidewalls of the first to third electrodes EL1, EL2, and EL3 may be vertically aligned with each other. In other words, the sidewalls of the first to third electrodes EL1, EL2, and EL3 of the another first pad portion PAD1 may be vertically coplanar with each other.

Likewise, in at least one of the second pad portions PAD2, a sidewall of the first electrode EL1 corresponding to the uppermost electrode may be horizontally spaced apart from a sidewall of the second electrode EL2 corresponding to the lowermost electrode. In example embodiments, the horizontal distance between the sidewalls of the first and second electrodes EL1 and EL2 may be less than a half of the horizontal distance between the ends of the top surfaces of the second pad portions PAD2. In addition, the sidewall of the third electrode EL3 disposed between the first and second electrodes EL1 and EL2 may be disposed between the sidewalls of the first and second electrodes EL1 and EL2 when viewed from a plan view.

In example embodiments, in another of the second pad portions PAD2, sidewalls of the first to third electrodes EL1, EL2, and EL3 may be vertically aligned with each other. In other words, the sidewalls of the first to third electrodes EL1, EL2, and EL3 of the another second pad portion PAD2 may be vertically coplanar with each other.

Figure 16:
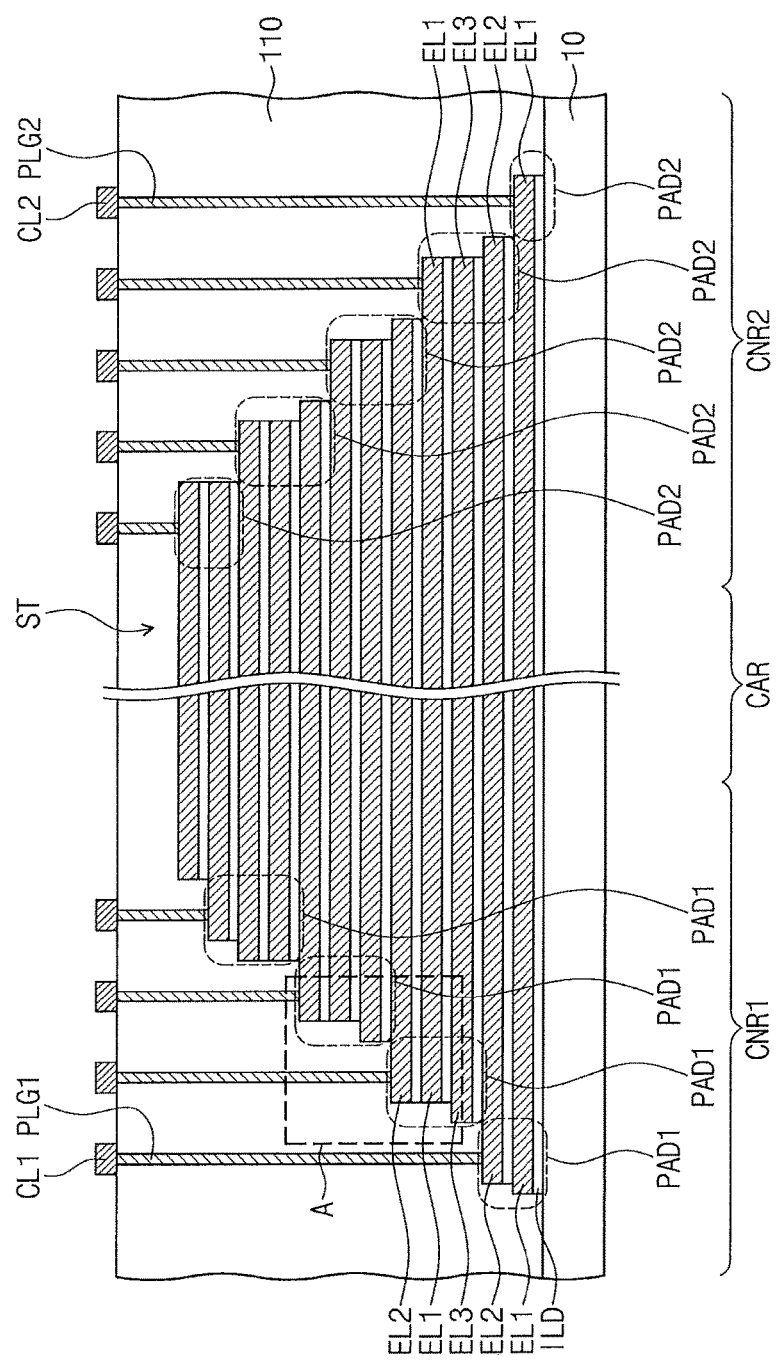
FIG. 16 is a cross-sectional view illustrating a 3D semiconductor device according to some embodiments of the inventive concepts.
Figure 17:
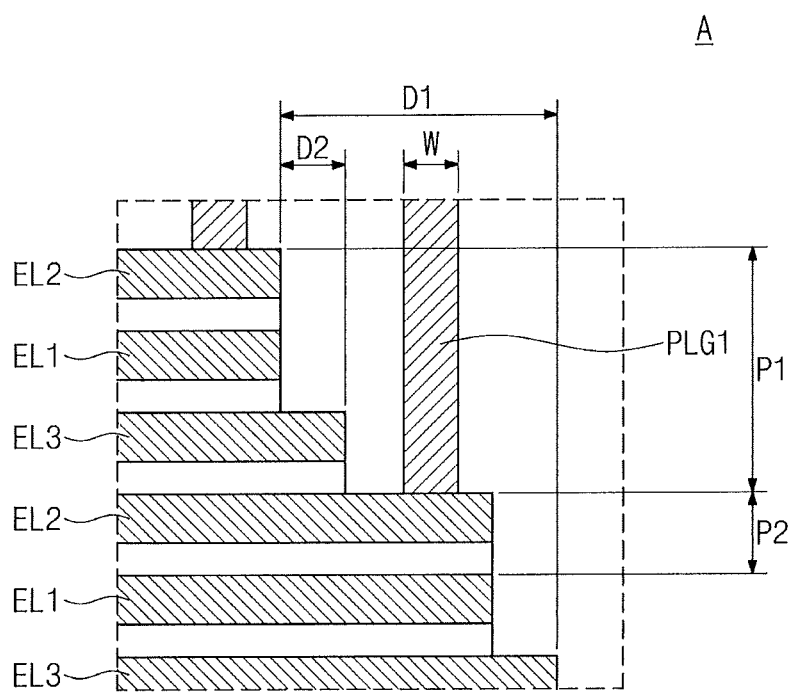
FIG. 17 is an enlarged view of a portion 'A' of FIG. 16.

FIG. 16 is a cross-sectional view illustrating a 3D semiconductor device according to example embodiments of the inventive concepts, and FIG. 17 is an enlarged view of a portion 'A' of FIG. 16. In the present example embodiment, the descriptions of the same elements or technical features as in the embodiment of FIGS. 12 and 13 will be omitted or mentioned only briefly for the purpose of ease and convenience in explanation.

Referring to FIGS. 16 and 17, each of some of the first pad portions PAD1 may include the first to third electrodes EL1, EL2, and EL3 vertically adjacent to each other. In each of some of the first pad portions PAD1, the sidewall of the second electrode EL2 corresponding to the uppermost electrode may be horizontally spaced apart from the sidewall of the third electrode EL3 corresponding to the lowermost electrode, and the sidewall of the first electrode EL1 may be vertically aligned with the sidewall of the second electrode EL2 corresponding to the uppermost electrode, as illustrated in FIG. 17. In example embodiments, the second distance D2 between the sidewalls of the second and third electrodes EL2 and EL3 may be less than a half of the first distance D1 between the ends of the top surfaces of the first pad portions PAD1.

Likewise, in each of some of the second pad portions PAD2, the sidewall of the first electrode EL1 corresponding to the uppermost electrode may be horizontally spaced apart from the sidewall of the second electrode EL2 corresponding to the lowermost electrode, and the sidewall of the third electrode EL3 may be vertically aligned with the sidewall of the first electrode EL1 corresponding to the uppermost electrode.

Figure 18:
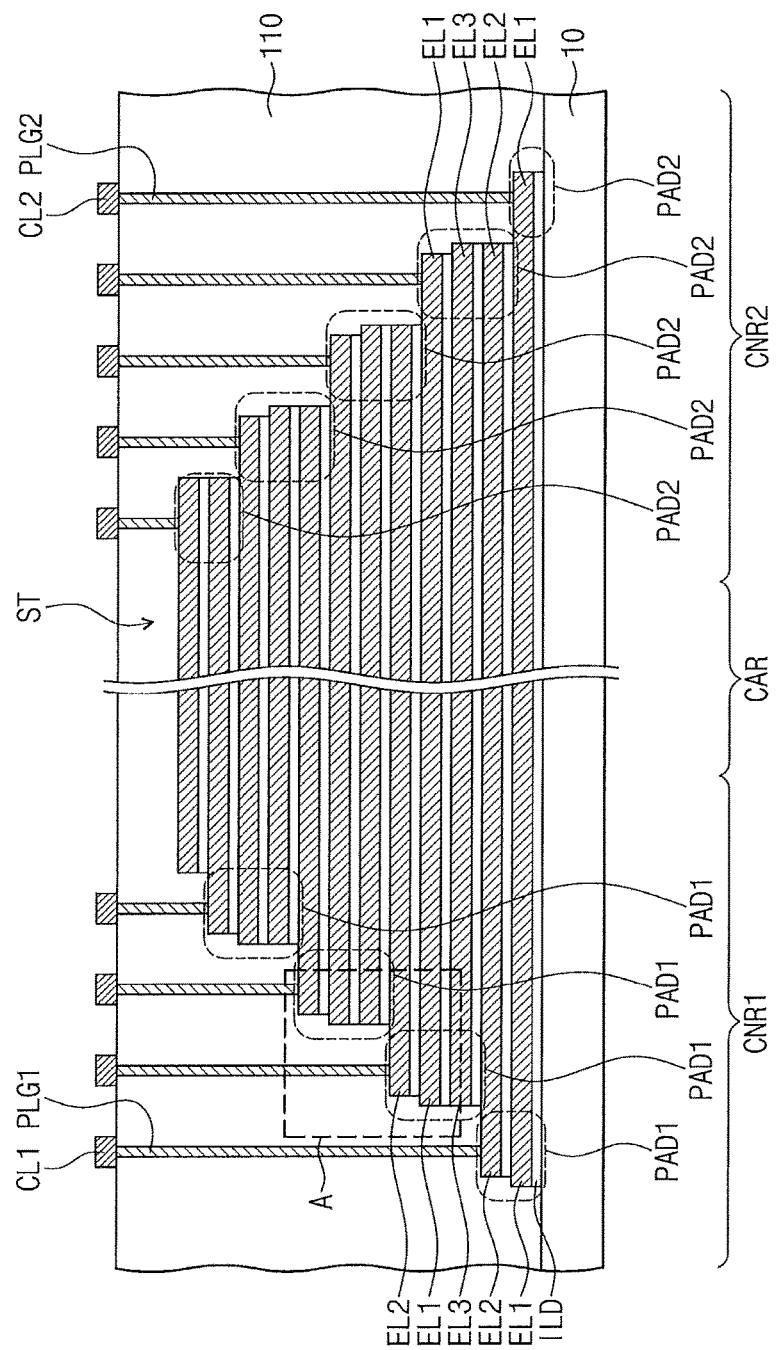
FIG. 18 is a cross-sectional view illustrating a 3D semiconductor device according to some embodiments of the inventive concepts.
Figure 19:
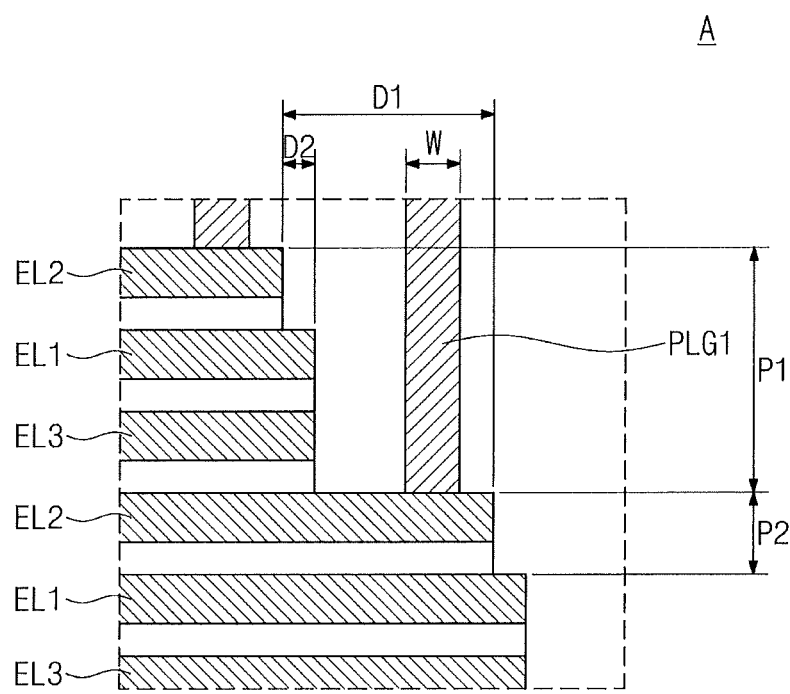
FIG. 19 is an enlarged view of a portion 'A' of FIG. 18.

FIG. 18 is a cross-sectional view illustrating a 3D semiconductor device according to example embodiments of the inventive concepts, and FIG. 19 is an enlarged view of a portion 'A' of FIG. 18. In the present embodiment, the descriptions of the same elements or technical features as in the embodiment of FIGS. 12 and 13 will be omitted or mentioned only briefly for the purpose of ease and convenience in explanation.

Referring to FIGS. 18 and 19, each of some of the first pad portions PAD1 may include the first to third electrodes EL1, EL2, and EL3 vertically adjacent to each other. In each of some of the first pad portions PAD1, the sidewall of the second electrode EL2 corresponding to the uppermost electrode may be horizontally spaced apart from the sidewall of the third electrode EL3 corresponding to the lowermost electrode, and the sidewall of the first electrode EL1 may be vertically aligned with the sidewall of the third electrode EL3 corresponding to the lowermost electrode, as illustrated in FIG. 19. In example embodiments, the second distance D2 between the sidewalls of the second and third electrodes EL2 and EL3 may be smaller than a half of the first distance D1 between the ends of the top surfaces of the first pad portions PAD1.

Likewise, in each of some of the second pad portions PAD2, the sidewall of the first electrode EL1 corresponding to the uppermost electrode may be horizontally spaced apart from the sidewall of the second electrode EL2 corresponding to the lowermost electrode, and the sidewall of the third electrode EL3 may be vertically aligned with the sidewall of the second electrode EL2 corresponding to the lowermost electrode.

Figure 20:
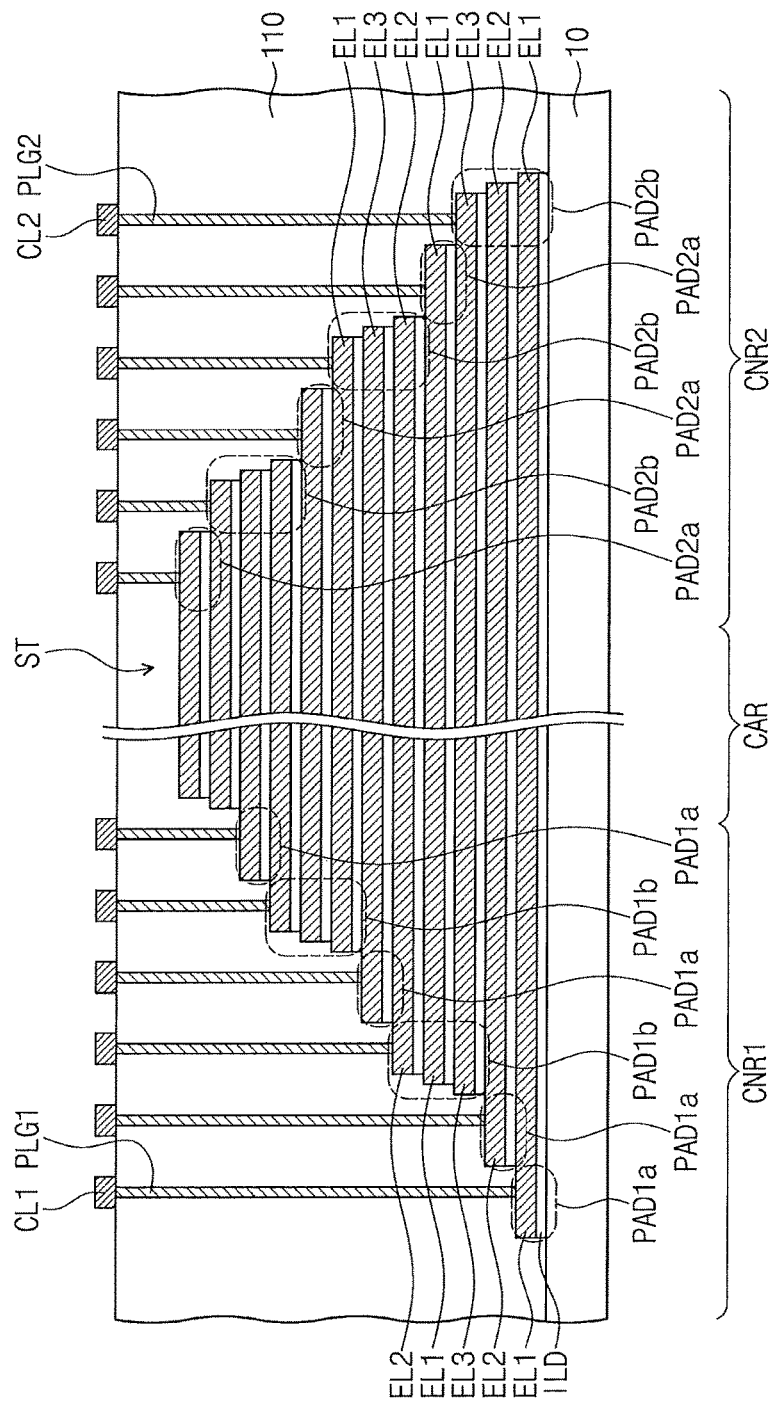
FIGS. 20 and 21 are cross-sectional views illustrating 3D semiconductor devices according to some embodiments of the inventive concepts.
Figure 21:
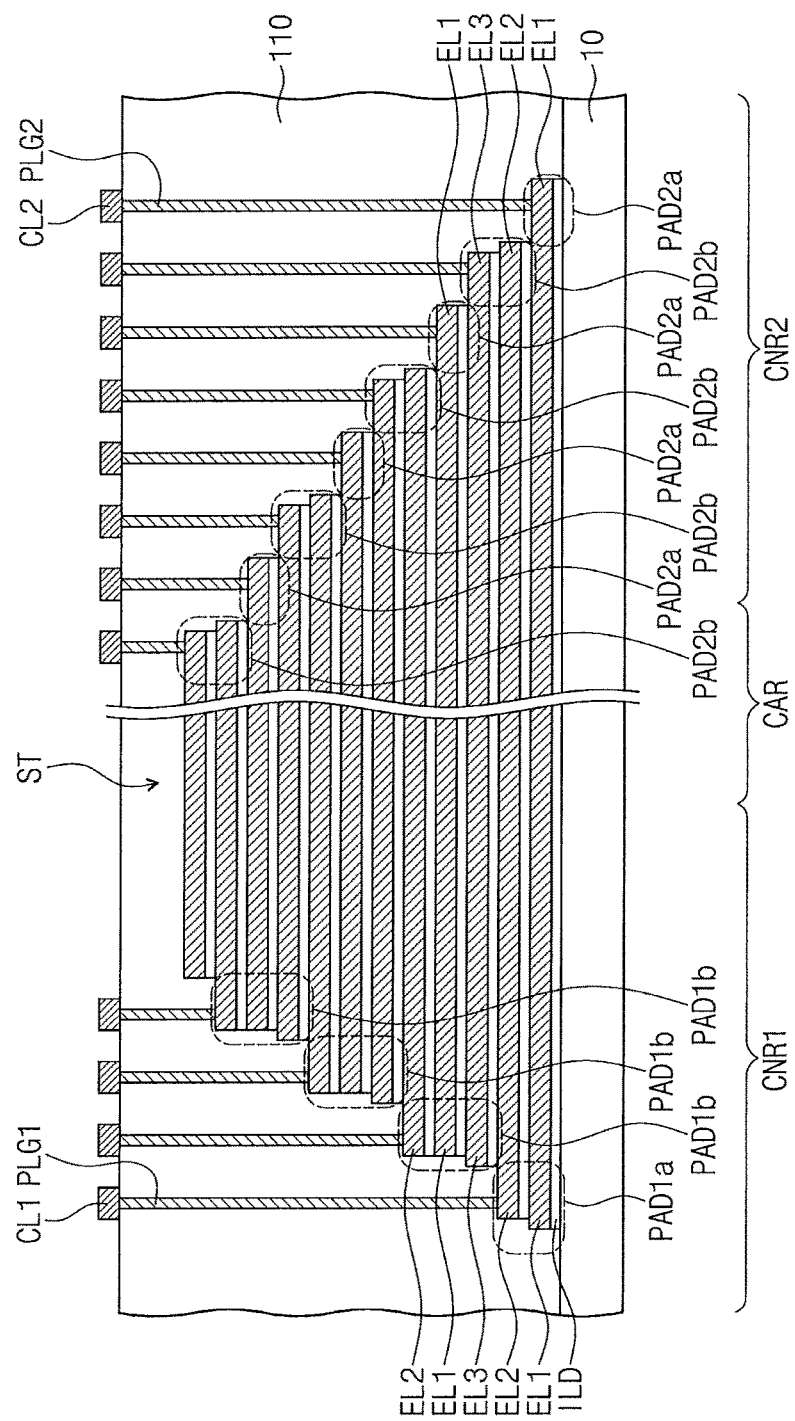

FIGS. 20 and 21 are cross-sectional views illustrating 3D semiconductor devices according to example embodiments of the inventive concepts. Hereinafter, the descriptions of the same elements or technical features as in the embodiment of FIGS. 12 and 13 will be omitted or mentioned only briefly for the purpose of ease and convenience in explanation.

Referring to FIG. 20, the stack structure ST may include first pad portions PAD1 disposed at positions horizontally and vertically different from each other in the first connection region CNR1. In example embodiments, one or some of the first pad portions PAD1 may have a first vertical thickness, and another or others of the first pad portions PAD1 may have a second vertical thickness. For example, the number of electrodes included in at least one of the first pad portions PAD1 may be different from the number of electrodes included in at least another of the first pad portions PAD1.

In example embodiments, the first pad portions PAD1 may include first pads PAD1a and second pads PAD1b, as illustrated in FIG. 20. Each of the first pads PAD1a may have one electrode, and each of the second pads PAD1b may have a plurality of electrodes sequentially stacked. In example embodiments, the first pad PAD1a may be disposed between the second pads PAD1b vertically adjacent to each other in the first connection region CNR1. In each of the second pads PAD1b, a sidewall of the uppermost electrode may be horizontally spaced apart from a sidewall of the lowermost electrode. In example embodiments, a horizontal distance between sidewalls of the uppermost and lowermost electrodes may be less than a half of a horizontal distance between ends of top surfaces of the first pad portions PAD1 adjacent to each other.

In addition, the stack structure ST may include second pad portions PAD2 disposed at positions horizontally and vertically different from each other in the second connection region CNR2. Like the first pad portions PAD1, the second pad portions PAD2 may have vertical thicknesses different from each other. In other words, the second pad portions PAD2 may include first pads PAD2a of which each has one electrode, and second pads PAD2b of which each has a plurality of electrodes sequentially stacked. In example embodiments, the first pad PAD2a may be disposed between the second pads PAD2b vertically adjacent to each other in the second connection region CNR2.

Referring to FIG. 21, vertical thicknesses of the first pad portions PAD1 of the first connection region CNR1 may be different from those of the second pad portions PAD2 of the second connection region CNR2. In addition, the first pad portions PAD1 of the first connection region CNR1 may include first and second pads PAD1a and PAD1b of which the vertical thicknesses are different from each other. In example embodiments, the first pad PAD1a may have end portions of two electrodes sequentially stacked, and the second pad PAD1b may have end portions of three electrodes sequentially stacked. In each of the first and second pads PAD1a and PAD1b, the horizontal distance between the sidewalls of the uppermost and lowermost electrodes may be less than a half of the horizontal distance between the ends of the top surfaces of the first pad portions PAD1.

The second pad portions PAD2 of the second connection region CNR2 may include first and second pads PAD2a and PAD2b of which the vertical thicknesses are different from each other. In example embodiments, the first pad PAD2a may have an end portion of one electrode, and the second pad PAD2b may have end portions of two electrodes sequentially stacked. A horizontal distance between sidewalls of the electrodes stacked in the second pad PAD2b may be less than a half of a horizontal distance between ends of top surfaces of the second pad portions PAD2 adjacent to each other.

Figure 22:
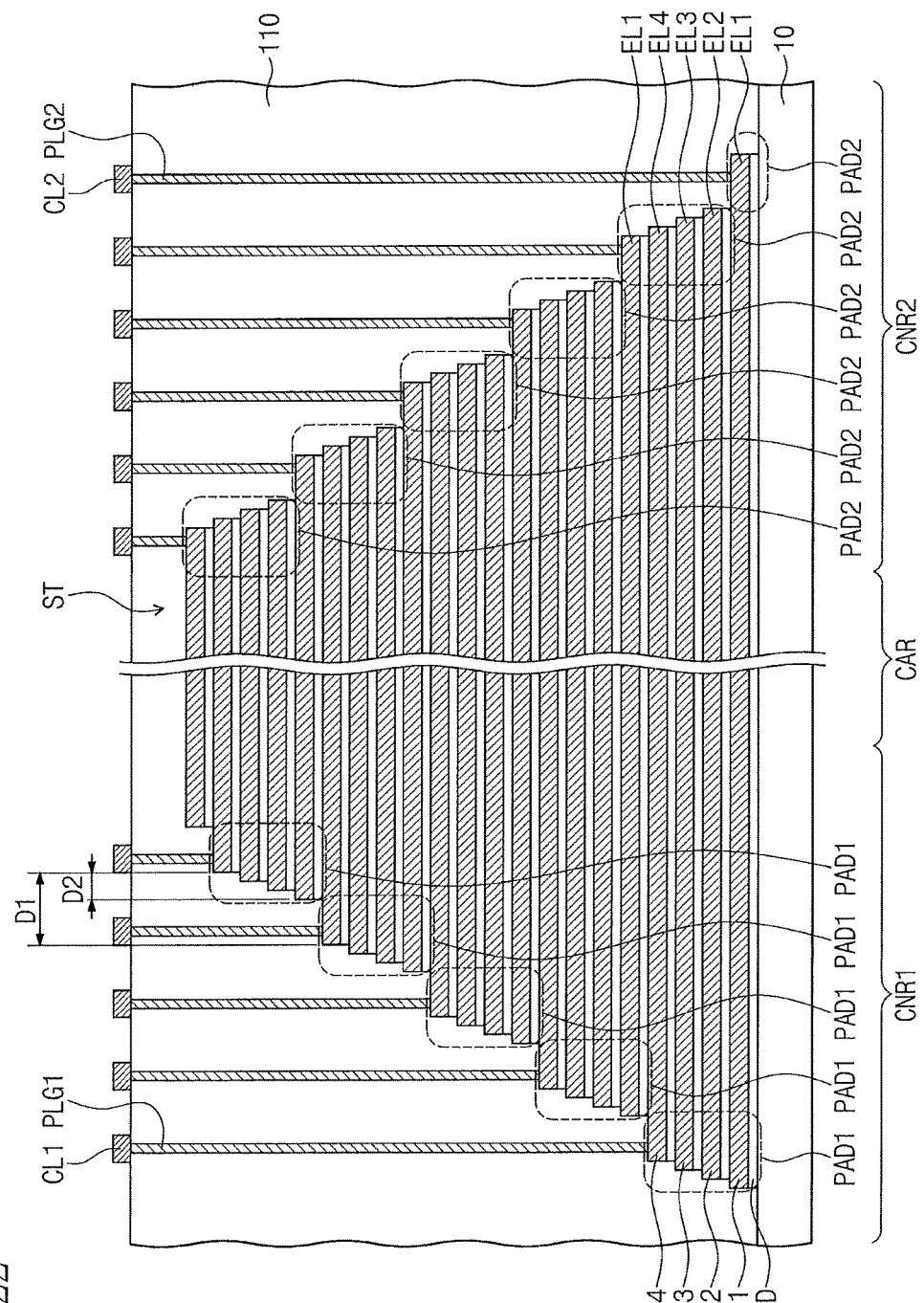
FIGS. 22 and 23 are cross-sectional views illustrating 3D semiconductor devices according to some embodiments of the inventive concepts.
Figure 23:
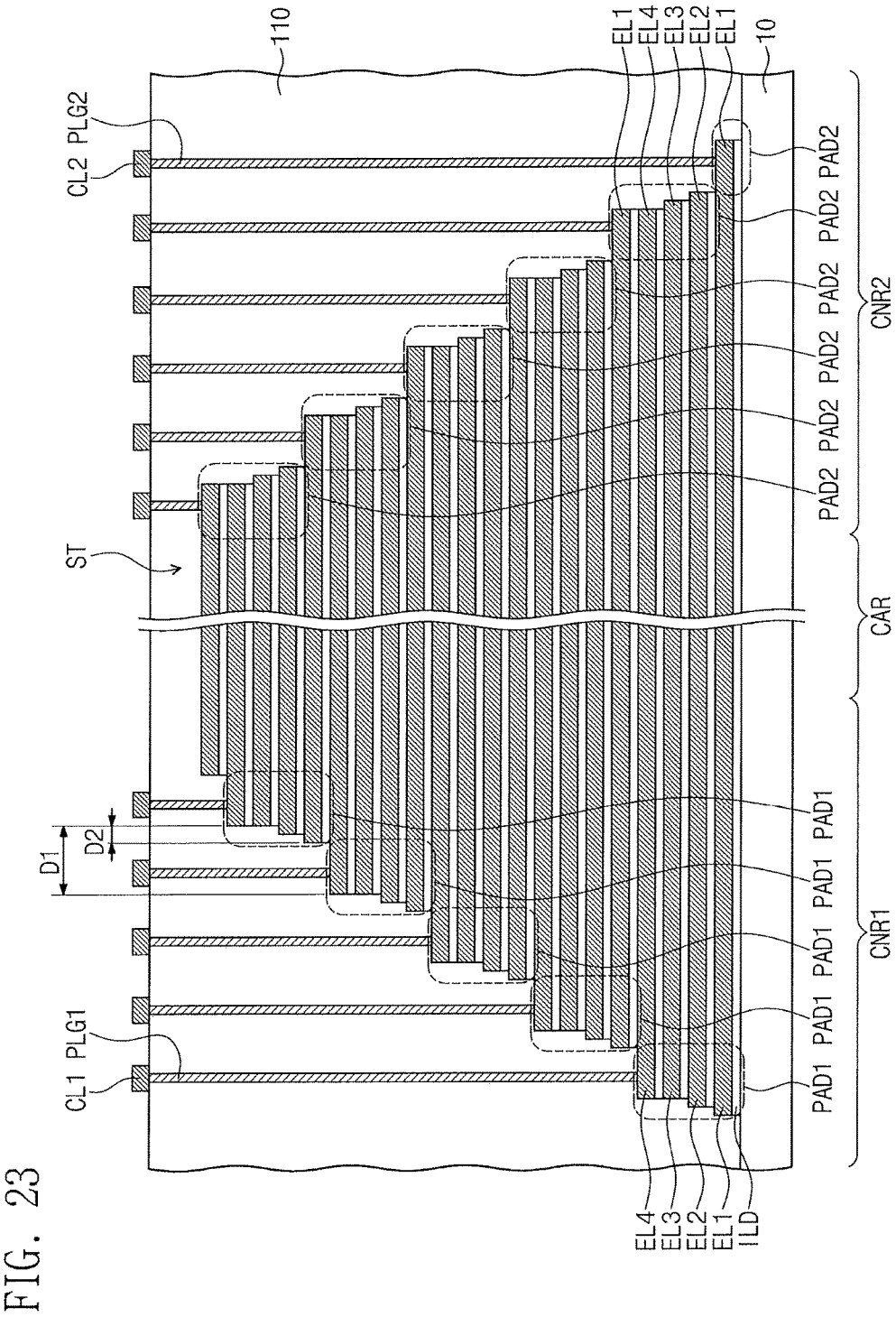

FIGS. 22 and 23 are cross-sectional views illustrating 3D semiconductor devices according to example embodiments of the inventive concepts. In the present example embodiment, the descriptions of the same elements or technical features as in the embodiment of FIG. 8 will be omitted or mentioned only briefly for the purpose of ease and convenience in explanation.

Referring to FIGS. 22 and 23, a stack structure ST may include a plurality of stacks stacked on the substrate 10, and lengths of the stacks may be sequentially reduced as a distance from the substrate 10 increases. Thus, the stack structure ST may have stepwise structures in the first and second connection regions CNR1 and CNR2.

In detail, the stack structure ST may include first pad portions PAD1, which are disposed at positions horizontally and vertically different from each other in the first connection region CNR1. In addition, the stack structure ST may further include second pad portions PAD2, which are disposed at positions horizontally and vertically different from each other in the second connection region CNR2.

In example embodiments, each of the stacks STR may include first, second, third, and fourth electrodes EL1, EL2, EL3, and EL4 sequentially stacked. Each of the pad portions PAD may include end portions of the first to fourth electrodes EL1, EL2, EL3, and EL4 vertically adjacent to each other. Each of the second pad portions PAD2 may include end portions of the first to fourth electrodes EL1, EL2, EL3, and EL4 vertically adjacent to each other. In each of the first pad portions PAD1, the uppermost electrode may be the fourth electrode EL4. In each of the second pad portions PAD2, the uppermost electrode may be the first electrode EL1.

In example embodiments, ends of top surfaces of the first pad portions PAD1 may be horizontally spaced apart from each other by a first distance D1. In each of the first pad portions PAD1, sidewalls of the lowermost and uppermost electrodes may be horizontally spaced apart from each other by a second distance D2. The second distance D2 may be less than a half of the first distance D1. The second pad portions PAD2 may be similar to the first pad portions PAD1.

In each of the first pad portions PAD1, the sidewall of the fourth electrode EL4 corresponding to the uppermost electrode may be horizontally spaced apart from the sidewall of the first electrode EL1 corresponding to the lowermost electrode by the second distance D2. In addition, in each of the first pad portions PAD1, sidewalls of the second and third electrodes EL2 and EL3 may be horizontally spaced apart from each other between the sidewalls of the first and fourth electrodes EL1 and EL4, as illustrated in FIG. 22. Alternatively, in each of the first pad portions PAD1, the sidewall of the second electrode EL2 may be horizontally spaced apart from the sidewalls of the first and third electrodes EL1 and EL3, and the sidewall of the third electrode EL3 may be vertically aligned with the sidewall of the fourth electrode EL4, as illustrated in FIG. 23. In addition, the positions of the sidewalls of the second and third electrodes EL2 and EL3 of the first pad portion PAD1 may be variously modified as described with reference to FIGS. 4 to 7.

Each of the first pad portions PAD1 may have a stepwise sidewall profile by the first to fourth electrodes EL1 to EL4. In other words, the stack structure ST may have a sidewall profile of a first stepwise structure by the first pad portions PAD1, and each of the first pad portions PAD1 may have a sidewall profile of a second stepwise structure by the first to fourth electrodes EL1 to EL4. In example embodiments, the first stepwise structure may have a first inclination angle (see θ1 of FIG. 3) smaller than 90 degrees, and the second stepwise structure may have a second inclination angle (see θ2 of FIG. 3) which is greater than the first inclination angle (see θ1 of FIG. 3) and smaller than 90 degrees. In addition, the stack structure ST may also have the sidewall profiles of the first and second stepwise structures in the second connection region CNR2.

Hereinafter, a method of forming a stack structure of a 3D semiconductor device according to example embodiments of the inventive concepts will be described with reference to FIGS. 24 to 28.

FIGS. 24 to 28 are cross-sectional views illustrating an example method of forming a stack structure of a 3D semiconductor device according to example embodiments of the inventive concepts.

Figure 24:
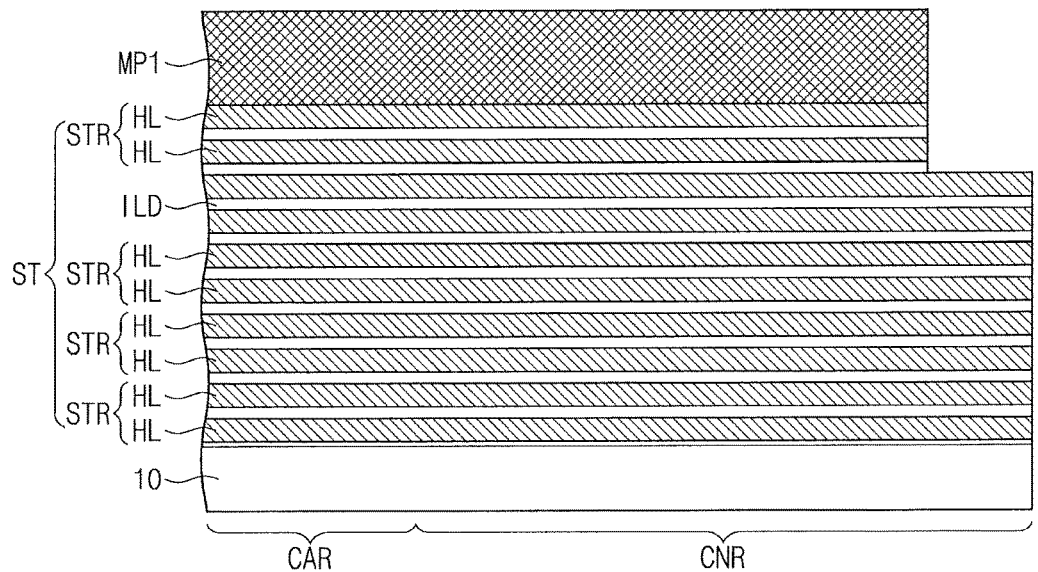
FIGS. 24 to 28 are cross-sectional views illustrating a method of forming a stack structure of a 3D semiconductor device according to some embodiments of the inventive concepts.

Referring to FIG. 24, a thin layer structure may be formed on a substrate 10 including a cell array region CAR and a connection region CNR. The thin layer structure may include a plurality of stacks STR vertically stacked on the substrate 10, and each of the stacks STR may include a plurality of horizontal layers HL and a plurality of insulating layers ILD that are alternately stacked. In example embodiments, each of the stacks STR may include two horizontal layers HL.

In example embodiments, the thin layer structure may be patterned to form a stack structure ST having stepwise shape on the substrate 10 of the connection region CNR. In other words, forming the stack structure ST may include repeatedly performing an etching process on the thin layer structure a plurality of times.

In example embodiments, the process of forming the stack structure ST may include pad etching processes for forming pad portions of the stack structure ST and a sub-etching process for reducing a gradient of a sidewall profile of each of the pad portions with respect to a top surface of the substrate 10. The pad etching process and the sub-etching process may be alternately and repeatedly performed.

In example embodiments, as illustrated in FIG. 24, a mask pattern MP1 covering the cell array region CAR and a portion of the connection region CNR may be formed on the thin layer structure, and the pad etching process may be performed on the thin layer structure using the mask pattern MP1 as an etch mask. At this time, the pad etching process may etch a plurality of the horizontal layers HL. In example embodiments, an etch depth of the pad etching process may correspond to a vertical pitch of the pad portions. For example, the etch depth of the pad etching process may be about twice a vertical pitch of the horizontal layers HL.

Figure 25:
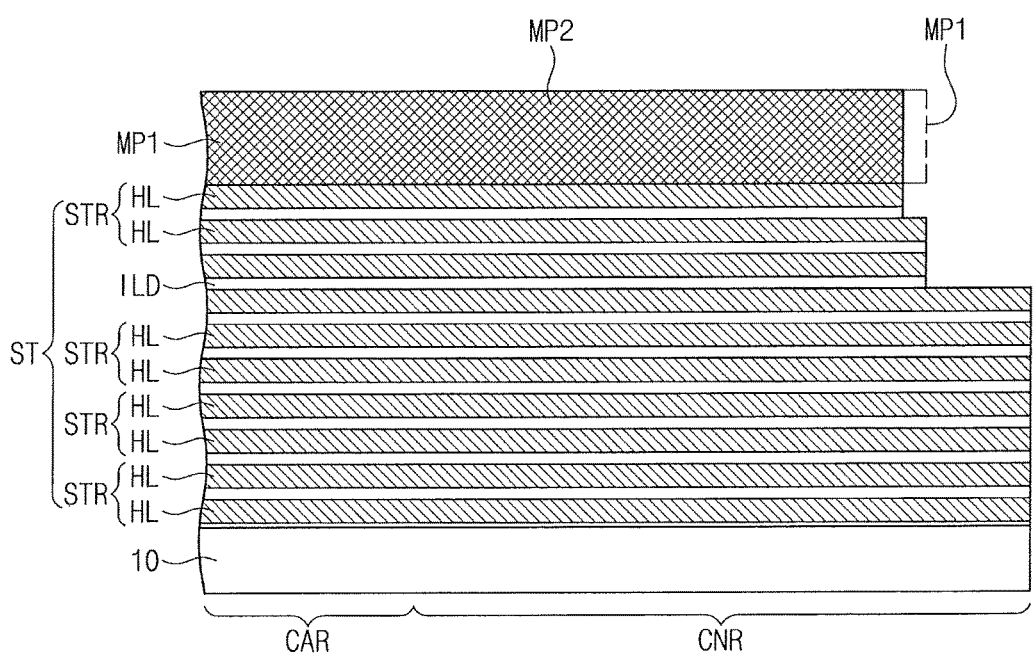

Next, referring to FIG. 25, the mask pattern MP1 may be etched such that a sidewall of the mask pattern MP1 is laterally moved by the second distance smaller than the half of the first distance, thereby forming a sub-mask pattern MP2. The sub-etching process may be performed on the thin layer structure using the sub-mask pattern MP2 as an etch mask. Here, an etch depth of the sub-etching process may be substantially equal to the vertical pitch of the horizontal layers HL.

After the sub-etching process, the sub-mask pattern MP2 may be etched such that a sidewall of the sub-mask pattern MP2 is moved by the first distance, thereby forming a reduced mask pattern MP1. Next, the pad etching process may be performed again on the thin layer structure using the reduced mask pattern MP1 as an etch mask.

Figure 26:
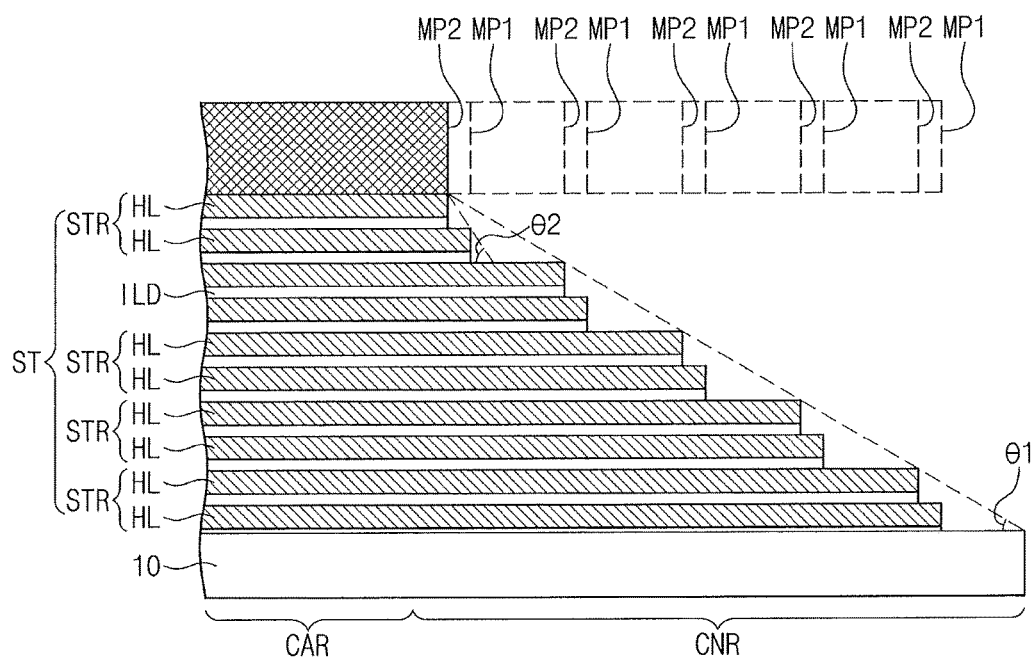

Because the pad etching process and the sub-etching process are alternately and repeatedly performed as described above, the stack structure ST including the pad portions may be formed as illustrated in FIG. 26. The pad portions may be disposed at positions horizontally and vertically different from each other on the substrate 10 in the connection region CNR. As described above, the stack structure ST may have the first stepwise structure having the first inclination angle θ1 realized by the pad portions and the second stepwise structure having the second inclination angle θ2 realized by the horizontal layers HL of each of the pad portions.

Figure 27:
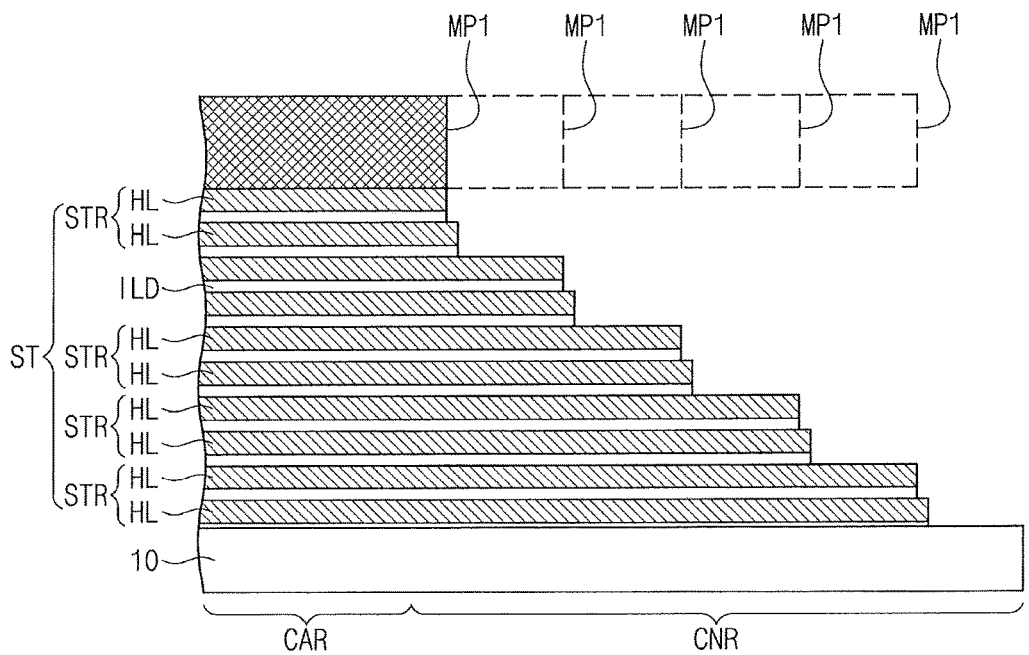
Figure 28:
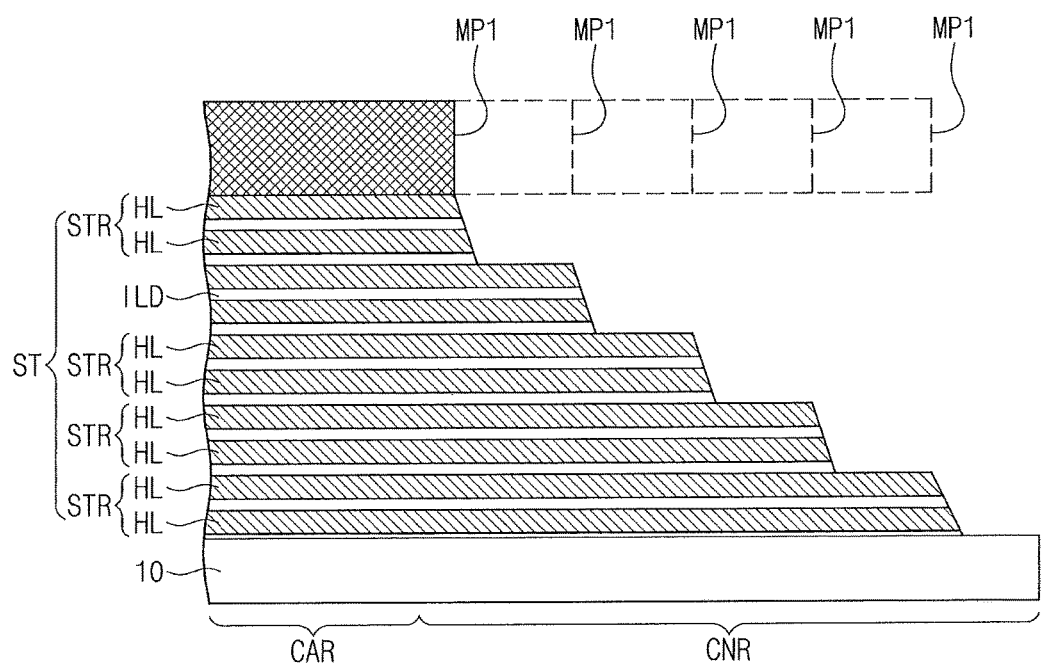

Meanwhile, referring to FIGS. 27 and 28, the pad portions having the sidewall profile of the second stepwise structure may be formed by repeatedly performing the pad etching process a plurality of times. The etch depth of the pad etching process may be equal to or greater than twice the vertical pitch of the horizontal layers HL. In example embodiments, the pad etching process using the mask pattern MP1 as an etch mask and the process of laterally moving the sidewall of the mask pattern MP1 by the first distance D1 may be alternately and repeatedly performed.

In detail, when a plurality of the horizontal layers HL are etched during the pad etching process using the mask pattern MP1 as an etch mask, an etch selectivity with respect to the lowermost horizontal layer HL of each of the stacks STR may be reduced as the number of the horizontal layers HL increases. As a result, positions of sidewalls of the stacked horizontal layers HL may be different from each other and the sidewalls of the horizontal layers HL exposed by the pad etching process may be disposed at positions horizontally spaced apart from each other or may be inclined as illustrated in FIG. 28.

Figure 29:
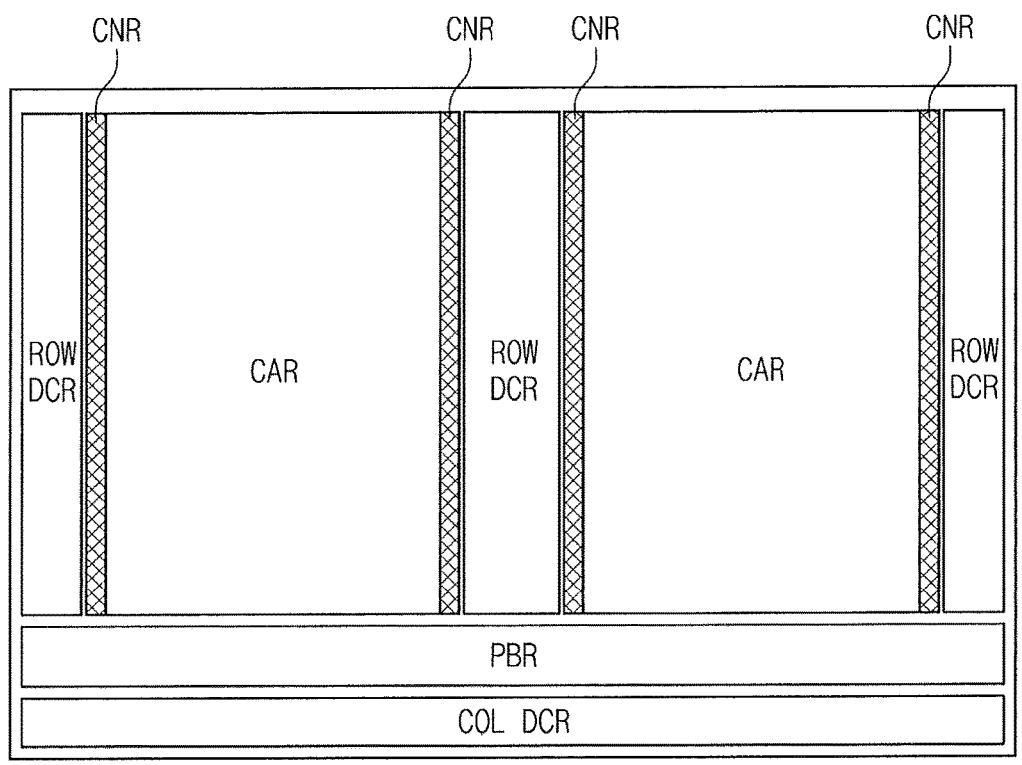
FIG. 29 is a schematic block diagram illustrating a 3D semiconductor memory device according to some embodiments of the inventive concepts.

FIG. 29 is a schematic block diagram illustrating a 3D semiconductor memory device according to example embodiments of the inventive concepts.

Referring to FIG. 29, a semiconductor memory device may include a cell array region CAR and a peripheral circuit region. The peripheral circuit region may include row decoder regions ROW DCR, a page buffer region PBR, and a column decoder region COL DCR. In addition, a connection region CNR may be disposed between the cell array region CAR and the row decoder region ROW DCR.

A memory cell array may be disposed in the cell array region CAR. The memory cell array may include a plurality of memory cells three dimensionally arranged. The memory cell array may include the plurality of memory cells, a plurality of word lines, and a plurality of bit lines. The word lines and the bit lines may be electrically connected to the memory cells.

A row decoder for selecting the word lines of the memory cell array may be disposed in the row decoder region ROW DCR. An interconnection structure for electrically connecting the memory cell array to the row decoder may be disposed in the connection region CNR. In response to address signals, the row decoder may select one among memory blocks of the memory cell array and may select one among the word lines of the selected memory block. The row decoder may respectively provide a first word line voltage and second word line voltages generated from a voltage generating circuit (not shown) to the selected word line and unselected word lines in response to a control signal of a control circuit (not shown).

A page buffer for sensing data stored in the memory cells may be disposed in the page buffer region PBR. According to an example operation mode, the page buffer may temporarily store data to be stored in the memory cells or may sense data stored in the memory cells. The page buffer may operate as a write driver circuit in a program operation mode and may operate as a sense amplifier circuit in a read operation mode.

A column decoder connected to the bit lines of the memory cell array may be disposed in the column decoder region COL DCR. The column decoder may provide a data transmission path between the page buffer and an external device (e.g., a memory controller).

Figure 30:
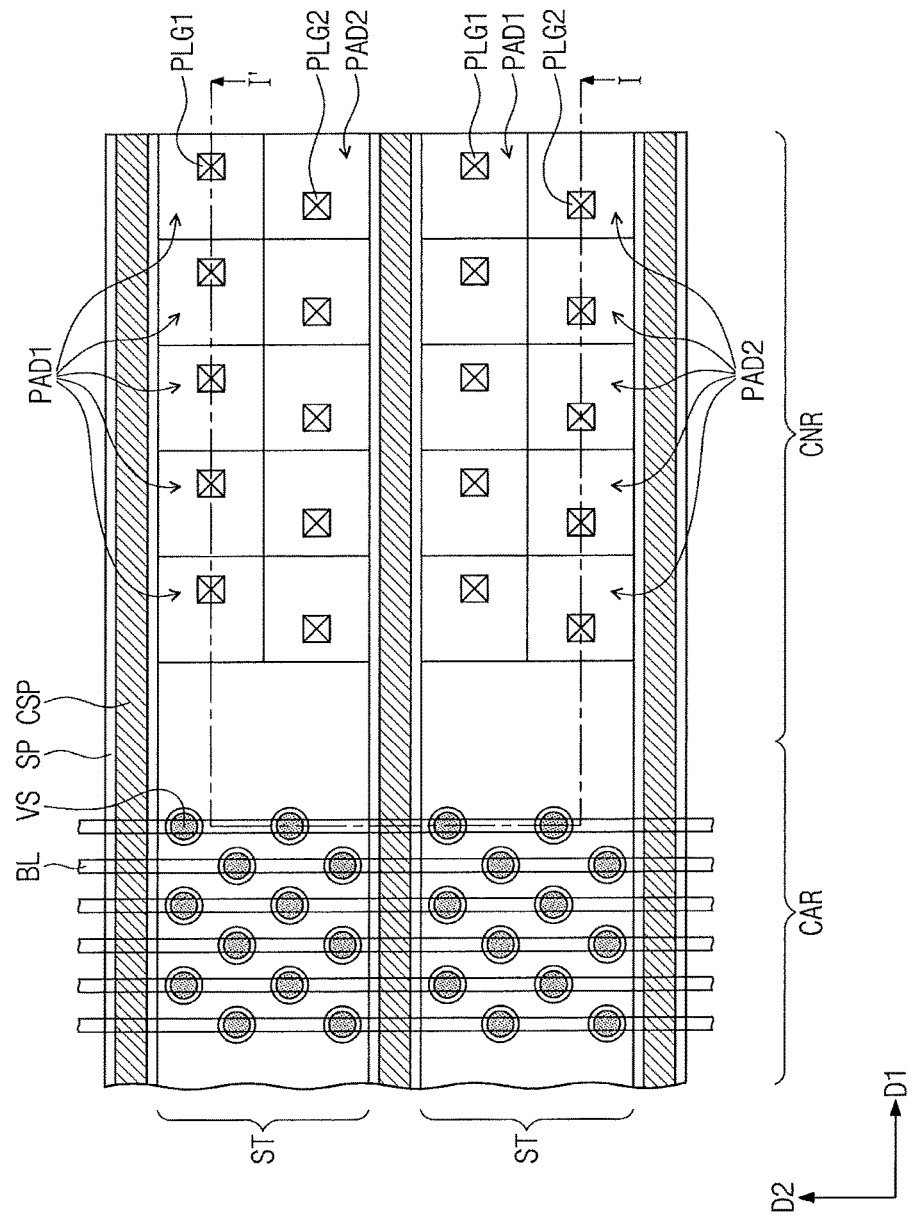
FIG. 30 is a plan view illustrating a 3D semiconductor memory device according to some embodiments of the inventive concepts.
Figure 31:
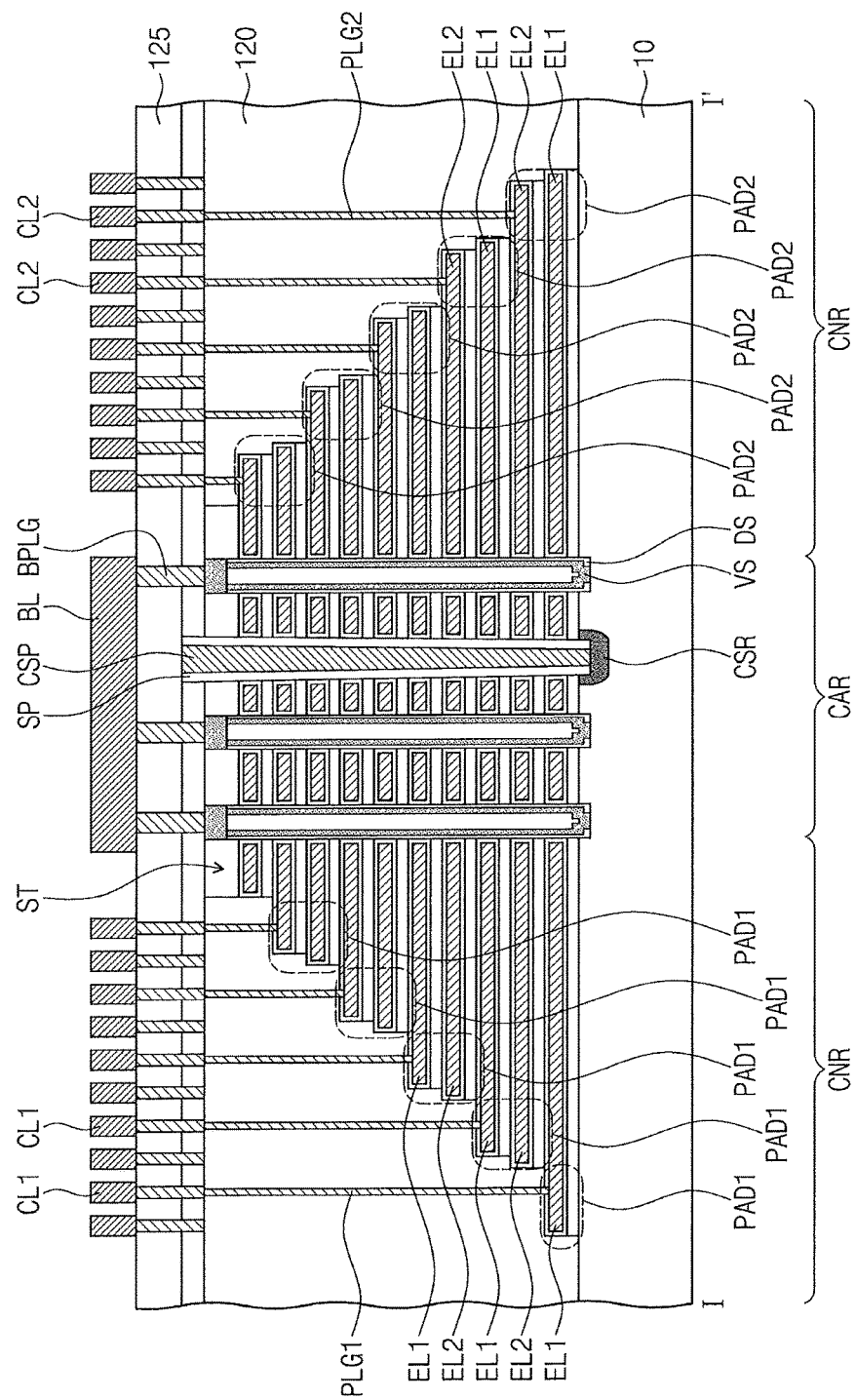
FIG. 31 is a cross-sectional view taken along a line I-I' of FIG. 30 to illustrate a 3D semiconductor memory device according to some embodiments of the inventive concepts.

FIG. 30 is a plan view illustrating a 3D semiconductor memory device according to example embodiments of the inventive concepts. FIG. 31 is a cross-sectional view taken along a line I-I' of FIG. 30 to illustrate a 3D semiconductor memory device according to some embodiments of the inventive concepts.

Referring to FIGS. 30 and 31, a substrate 10 may include a cell array region CAR and a connection region CNR. The substrate 10 may be a bulk silicon substrate, a silicon-on-insulator (SOI) substrate, a germanium substrate, a germanium-on-insulator (GOI) substrate, a silicon-germanium substrate, or a substrate having an epitaxial thin layer obtained by performing a selective epitaxial growth (SEG) process, for example. The substrate 10 may be formed of a semiconductor material. For example, the substrate 10 may include at least one of silicon (Si), germanium (Ge), silicon-germanium (SiGe), gallium-arsenic (GaAs), indium-gallium-arsenic (InGaAs), or aluminum-gallium-arsenic (AlGaAs), for example.

Stack structures ST may extend in parallel to each other along a first direction D1 on the substrate 10 and may be spaced apart from each other in a second direction D2. Each of the stack structures ST may include electrodes EL vertically stacked on the substrate 10 and insulating layers ILD disposed between the electrodes EL. In example embodiments, each of the stack structures ST may include first and second electrodes EL1 and EL2 alternately and repeatedly stacked. Thicknesses of the insulating layers of the stack structure ST may be varied according to characteristics of the semiconductor memory device. In example embodiments, a thickness of the lowermost insulating layer ILD may be less than thicknesses of others of the insulating layers ILD, and the thicknesses of the others of the insulating layers ILD may be substantially equal to each other. In example embodiments, one or some of the insulating layers ILD may be thicker than others of the insulating layers ILD.

In example embodiments, the connection region CNR may include a first connection region CNR1 and a second connection region CNR2. In example embodiments, each of the stack structures ST may include first pad portions PAD1 in the first connection region CNR1 and second pad portions PAD2 in the second connection region CNR2. In example embodiments, each of the first and second pad portions PAD1 and PAD2 may include end portions of the first and second electrodes EL1 and EL2 vertically adjacent to each other.

The first pad portions PAD1 may be arranged along the first direction D1 in the connection region CNR when viewed from a plan view. The second pad portions PAD2 may be arranged along the first direction D1 and adjacent to the first pad portion PAD1 in the second direction D2 when viewed from a plan view.

Ends of top surfaces of the first pad portions PAD1 adjacent to each other may be spaced apart from each other by a first distance in a longitudinal direction of the stack structure ST (i.e., in the first direction D1). A vertical pitch of the first pad portions PAD1 may be changed according to the number of the electrodes included in each of the first pad portions PAD1. The second pad portions PAD2 may be similar to the first pad portions PAD1.

A first contact plug PLG1 may be in contact with the uppermost electrode of each of the first pad portions PAD1, and a second contact plug PLG2 may be in contact with the uppermost electrode of each of the second pad portions PAD2.

In example embodiments, in each of the first and second pad portions PAD1 and PAD2, a sidewall of the lowermost electrode may be horizontally spaced apart from a sidewall of the uppermost electrode. In addition, the sidewalls of the electrodes EL of each of the first and second pad portions PAD1 and PAD2 may be horizontally spaced apart from each other between the first contact plugs PLG1 adjacent to each other or between the second contact plugs PLG2 adjacent to each other. A horizontal distance between the sidewalls of the uppermost and lowermost electrodes of each of the first and second pad portions PAD1 and PAD2 may be less than a half of the first distance.

In example embodiments, vertical structures VS may penetrate the stack structures ST so as to be electrically connected to the substrate 10 in the cell array region CAR. The vertical structures VS may include a semiconductor material or a conductive material. The vertical structures VS penetrating each of the stack structures ST may be arranged in a line in one direction (e.g., the first direction D1). Alternatively, the vertical structures VS penetrating each of the stack structures ST may be arranged in a zigzag form in one direction (e.g., the first direction D1). In example embodiments, the vertical structures VS may include a semiconductor material. In example embodiments, bottom surfaces of the vertical structures VS may be disposed at a level between a top surface and a bottom surface of the substrate 10. A contact pad may be disposed on a top end of each of the vertical structures VS, and a bit line contact plug BPLG may be connected to the contact pad.

In example embodiments, a data storage layer DS may be disposed between the stack structure ST and the vertical structure VS. In example embodiments, the data storage layer DS may include a vertical insulating pattern penetrating the stack structure ST and a horizontal insulating pattern extending from between the vertical insulating pattern and each of the electrodes EL onto top and bottom surfaces of each of the electrodes EL.

In example embodiments, the 3D semiconductor device may be an NAND flash memory device. For example, the data storage layer DS disposed between the stack structure ST and the vertical structure VS may include a tunnel insulating layer, a charge storage layer, and a blocking insulating layer. Data stored in the data storage layer DS may be changed using the Fowler-Nordheim tunneling induced by a difference in voltage between the vertical structure VS including the semiconductor material and the electrode EL of the stack structure ST.

Each of common source regions CSR may be disposed in the substrate 10 between the stack structures ST adjacent to each other. The common source regions CSR may extend in parallel to the stack structures ST along the first direction D1. The common source regions CSR may be formed by doping portions of the substrate 10 with dopants. A conductivity type of the common source regions CSR may be different from that of the substrate 10. For example, the common source regions CSR may include N-type dopants (e.g., arsenic (As) or phosphorus (P)).

A common source plug CSP may be connected to each of the common source regions CSR, and a sidewall insulating spacer SP may be disposed between the common source plug CSP and the stack structures ST. In example embodiments, the common source plug CSP may have a substantially uniform upper width and may extend in the first direction D1.

An upper filling insulation layer 120 may be disposed on an entire top surface of the substrate 10 to cover the plurality of stack structures ST. The upper filling insulation layer 120 may have a planarized top surface, and a thickness of the upper filling insulation layer 120 may become progressively greater from the cell array region CAR into the connection regions CNR. In other words, the upper filling insulation layer 120 may cover the first and second pad portions PAD1 and PAD2 of the stack structure ST in the connection region CNR.

In example embodiments, as described in above embodiments, the stack structure ST may have the sidewall profile of the first stepwise structure having the first inclination angle (see θ1 of FIG. 3) and realized by the first pad portions PAD1, and each of the first and second pad portions PAD1 and PAD2 may have the sidewall profile of the second stepwise structure having the second inclination angle (see θ2 of FIG. 3) and realized by the vertically adjacent electrodes thereof. The second inclination angle (see θ2 of FIG. 3) may be greater than the first inclination angle (see θ1 of FIG. 3) and smaller than 90 degrees. As a result, even though the number of the electrodes of each of the first and second pad portions PAD1 and PAD2 increases, the upper filling insulation layer 120 may easily fill the stepped region between the first pad portions PAD1 adjacent to each other and/or between the second pad portions PAD2 adjacent to each other.

A capping insulating layer 125 may be disposed on the upper insulating layer 120, and bit lines BL may be disposed on the capping insulating layer 125. The bit lines BL may extend in the second direction D2 to intersect the stack structures ST. The bit lines BL may be electrically connected to the vertical structures VS through the bit line contact plugs BPLG. In addition, first conductive lines CL1 and second conductive lines CL2 may be disposed on the capping insulating layer 125. The first conductive lines CL1 may be respectively connected to the first contact plugs PLG1, and the second conductive lines CL2 may be respectively connected to the second contact plugs PLG2.

Figure 32:
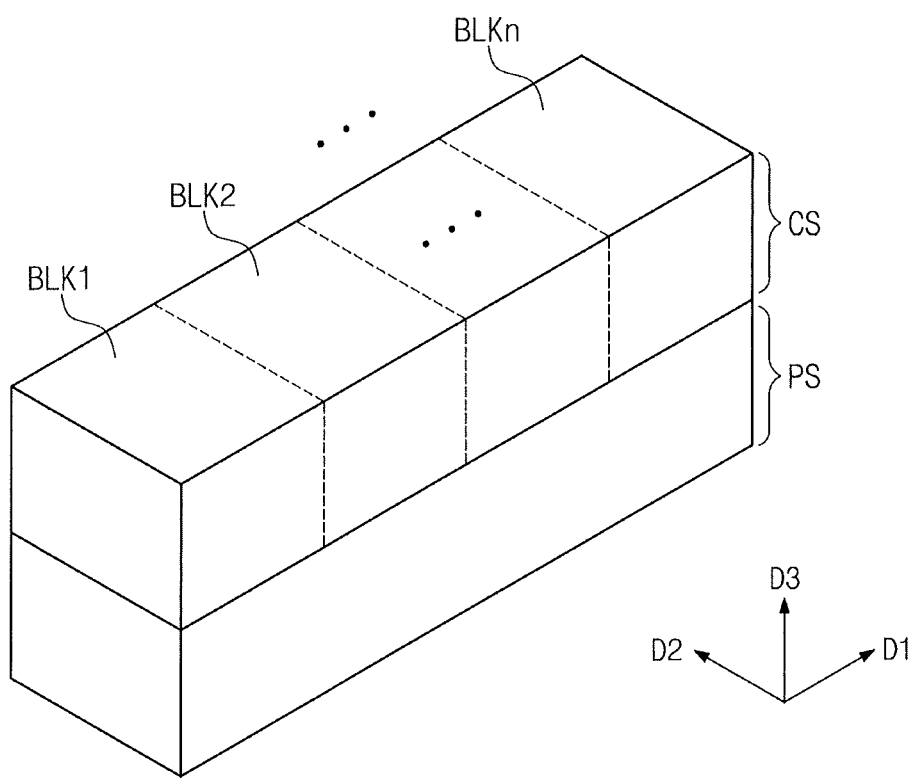
FIG. 32 is a schematic block diagram illustrating a 3D semiconductor memory device according to some embodiments of the inventive concepts.

FIG. 32 is a schematic block diagram illustrating a 3D semiconductor memory device according to example embodiments of the inventive concepts.

Referring to FIG. 32, a 3D semiconductor memory device according to example embodiments may include a peripheral logic structure PS and a cell array structure CS stacked on the peripheral logic structure PS. In other words, the cell array structure CS may overlap with the peripheral logic structure PS when viewed from a plan view.

In example embodiments, the peripheral logic structure PS may include row and column decoders, a page buffer, and control circuits. The cell array structure CS may include a plurality of memory blocks BLK1 to BLKn, each of which corresponds to a data erase unit. The memory blocks BLK1 to BLKn may include structures that are disposed on a plane defined by first and second directions D1 and D2 and are stacked along a third direction D3. Each of the memory blocks BLK1 to BLKn may include a memory cell array having a three-dimensional structure or a vertical structure. The memory cell array may include a plurality of memory cells three-dimensionally arranged, a plurality of word lines, and a plurality of bit lines. The word lines and the bit lines may be electrically connected to the memory cells.

Figure 33:
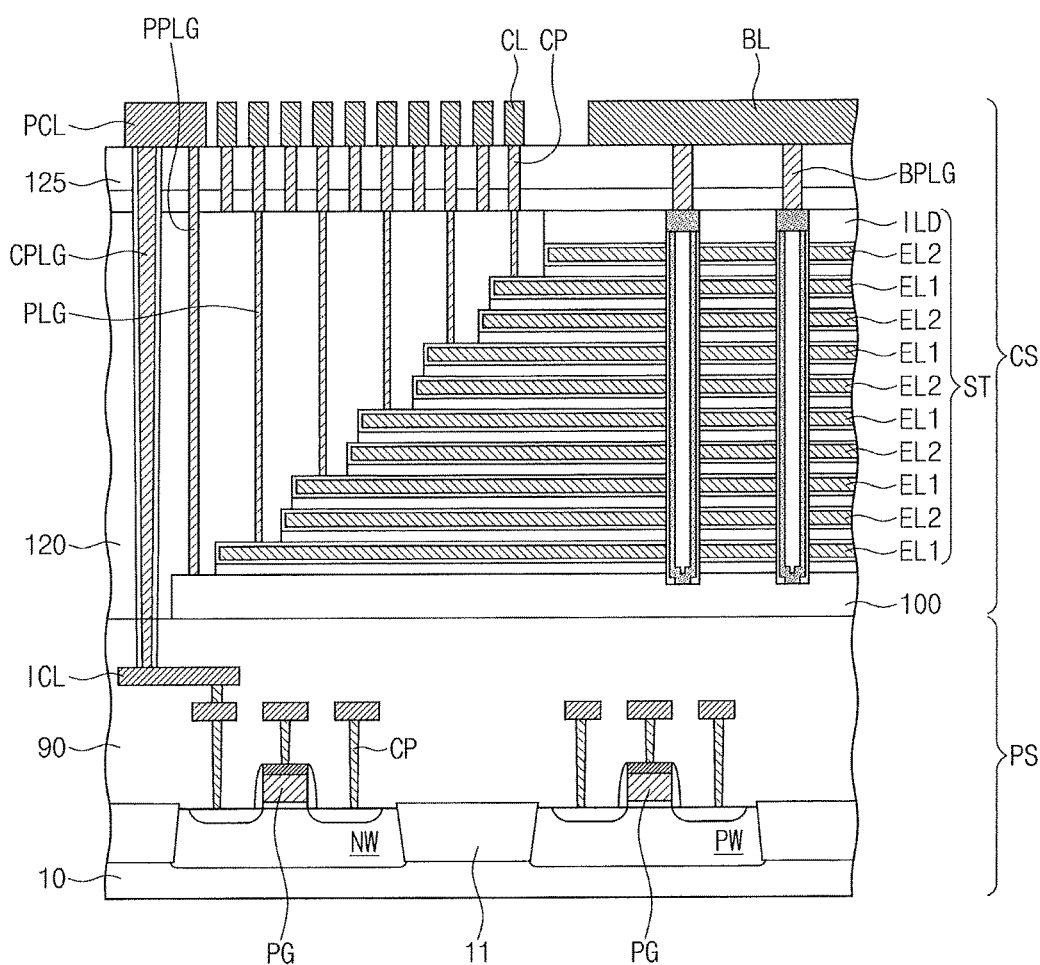
FIG. 33 is a cross-sectional view illustrating the 3D semiconductor memory device according to some embodiments of the inventive concepts, which is described with reference to FIG. 32.

FIG. 33 is a cross-sectional view illustrating the 3D semiconductor memory device according to example embodiments of the inventive concepts, which is described with reference to FIG. 32. Hereinafter, the descriptions of the same technical features as in the above embodiments will be omitted or mentioned only briefly for the purpose of ease and convenience in explanation.

Referring to FIG. 33, a peripheral logic structure PS and a cell array structure CS may be sequentially stacked on a semiconductor substrate 10. In other words, the peripheral logic structure PS may be disposed between the semiconductor substrate 10 and the cell array structure CS when viewed from a cross-sectional view and the cell array structure CS may overlap with the peripheral logic structure PS when viewed from a plan view.

The semiconductor substrate 10 may be a bulk silicon substrate, a silicon-on-insulator (SOI) substrate, a germanium substrate, a germanium-on-insulator (GOI) substrate, a silicon-germanium substrate, or a substrate having an epitaxial thin layer obtained by performing a selective epitaxial growth (SEG) process.

The peripheral logic structure PS may include row and column decoders, a page buffer, and control circuits. In other words, the peripheral logic structure PS may include NMOS and PMOS transistors, a resistor, and a capacitor which are electrically connected to the cell array structure CS. The peripheral logic structure PS may be formed on an entire top surface of the semiconductor substrate 10. In addition, the semiconductor substrate 10 may include an N-well region NW doped with N-type dopants and a P-well region PW doped with P-type dopants. Active regions ACT may be defined in the N-well region NW and P-well region PW by a device isolation layer 11.

The peripheral logic structure PS may include peripheral gate electrodes PG, source and drain dopant regions at both sides of each of the peripheral gate electrodes PG, peripheral circuit interconnections ICL, and a lower filling insulation layer 90 covering the peripheral circuits. In detail, PMOS transistors may be formed on the N-well region NW, and NMOS transistors may be formed on the P-well region PW. The peripheral circuit interconnections ICL may be electrically connected to the peripheral circuits through peripheral circuit plugs CP. For example, the peripheral circuit plugs CP and the peripheral circuit interconnections ICL may be electrically connected to the NMOS and PMOS transistors.

The lower filling insulation layer 90 may cover the peripheral circuits, the peripheral circuit plugs CP, and the peripheral circuit interconnections ICL. The lower filling insulation layer 90 may include a plurality of stacked insulating layers.

The cell array structure CS may be disposed on the lower filling insulation layer 90 and may include a horizontal semiconductor layer 100, stack structures ST, and vertical structures VS.

The horizontal semiconductor layer 100 may be formed on a top surface of the lower filling insulation layer 90 covering the peripheral circuits. In other words, a bottom surface of the horizontal semiconductor layer 100 may be in contact with the lower filling insulation layer 90. The horizontal semiconductor layer 100 may include a cell array region CAR and a connection region adjacent to the cell array region CAR, as described with reference to FIG. 1.

The horizontal semiconductor layer 100 may be formed of a semiconductor material. For example, the horizontal semiconductor layer 100 may include at least one of silicon (Si), germanium (Ge), silicon-germanium (SiGe), gallium-arsenic (GaAs), indium-gallium-arsenic (InGaAs), or aluminum-gallium-arsenic (AlGaAs). The horizontal semiconductor layer 100 may include a semiconductor material doped with dopants of a first conductivity type and/or an intrinsic semiconductor material not doped with dopants. In addition, the horizontal semiconductor layer 100 may have a crystal structure including at least one of a single-crystalline structure, an amorphous structure, or a poly-crystalline structure.

The stack structures ST may extend in parallel to each other along a first direction D1 on horizontal semiconductor layer 100 and may be spaced apart from each other in a second direction D2, as described with reference to FIG. 30. Each of the stack structures ST may include electrodes EL vertically stacked on the horizontal semiconductor layer 100 and insulating layers ILD disposed between the electrodes EL.

Each of the stack structures ST may have the stepwise structure for electrically connecting the electrodes EL to the peripheral logic structure PS in the connection region CNR, as described above. In other words, each of the stack structures ST may include pad portions disposed at positions vertically and horizontally different from each other in the connection region CNR, and each of the pad portions may include end portions of a plurality of the electrodes sequentially stacked.

An upper filling insulation layer 120 may be disposed on the horizontal semiconductor layer 100 to cover the end portions of the electrodes constituting the pad portions. In addition, a capping insulating layer 125 may cover the stack structures ST and the upper filling insulation layer 120. Furthermore, bit lines BL may be disposed on the capping insulating layer 125 and may extend in the second direction D2 to intersect the stack structures ST. The bit lines BL may be electrically connected to the vertical structures VS through the bit line contact plugs BPLG.

The vertical structures VS may penetrate the stack structures ST so as to be electrically connected to the horizontal semiconductor layer 100. Each of the vertical structures VS may include a semiconductor pattern electrically connected to the horizontal semiconductor layer 100.

A data storage layer DS may be disposed between the stack structure ST and the vertical structure VS.

Each of common source regions (not shown) may be disposed in the horizontal semiconductor layer 100 between the stack structures ST adjacent to each other. The common source regions may extend in parallel to the stack structures ST along the first direction D1. The common source regions may be formed by doping portions of the horizontal semiconductor layer 100 with dopants of which a conductivity type is opposite to that of the horizontal semiconductor layer 100.

An interconnection structure for electrically connecting the cell array structure CS to the peripheral logic structure PS may be disposed on end portions of the stack structures ST, which have the stepwise structures. The upper filling insulation layer 120 covering the end portions of the stack structures ST may be disposed on the horizontal semiconductor layer 100. The interconnection structure may include contact plugs PLG penetrating the upper filling insulation layer 120 so as to be connected to the end portions of the electrodes EL and conductive lines CL disposed on the upper filling insulation layer 120 so as to be connected to the contact plugs PLG. Vertical lengths of the contact plugs PLG may be sequentially reduced as a horizontal distance from the cell array region CAR decreases.

Pickup contact plugs PPLG may penetrate the upper filling insulation layer 120 so as to be connected to pickup regions (not shown) formed in the horizontal semiconductor layer 100. The pickup regions may include dopants of which a conductivity type is the same as that of the horizontal semiconductor layer 100. In example embodiments, a dopant concentration of the pickup region may be higher than that of the horizontal semiconductor layer 100.

Top surfaces of the pickup contact plugs PPLG may be substantially coplanar with top surfaces of the contact plugs PLG. The pickup contact plug PPLG may be electrically connected to the peripheral logic structure PS through a well conductive line PCL and a connection plug CPLG.

The connection plug CPLG may electrically connect the cell array structure CS to the peripheral logic structure PS. The connection plug CPLG may penetrate the upper filling insulation layer 120 and the horizontal semiconductor layer 100 so as to be connected to the peripheral circuit interconnection ICL of the peripheral logic structure PS.

As the height of the stack structure including vertically stacked electrodes increases, the number of the electrodes included in each pad portion of the stack structure may increase. However, according to example embodiments of the inventive concepts, each of the pad portions may have the sidewall profile of the second stepwise structure defined by the electrodes included in each of the pad portions. Thus, even though a height difference between the pad portions increases, the filling insulation layer may easily fill the stepped region defined between the pad portions vertically adjacent to each other.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A three:-dimensional (3D) semiconductor device comprising:
   a substrate including a cell array region and a connection region;
   a stack structure extending from the cell array region into the connection region, the stack structure including a first stack and a second stack on the first stack, each of the first and second stacks extending along a first direction and including a first electrode and a second electrode on the first electrode; and
   contact plugs connected to the second electrodes of the first and second stacks, respectively,
   wherein, in the first direction, a sidewall of the second electrode of the first stack is horizontally spaced apart from a sidewall of the second electrode of the second stack by a first distance in the connection region,
   wherein, in the first direction, a sidewall of the first electrode is horizontally spaced apart from the sidewall of the second electrode by a second distance in each of the first and second stacks,
   wherein the second distance is less than a half of the first distance,
   wherein the sidewall of the first electrode of the second stack is horizontally spaced apart from the sidewall of the second electrode of the first stack by a third distance,
   wherein the second distance in the second stack is less than the third distance, and
   wherein each of the contact plugs has a width greater than the second distance.

2. The 3D semiconductor device of claim 1, wherein the sidewalls of the first and second electrodes are disposed between the contact plugs adjacent to each other.

3. The 3D semiconductor device of claim 1, wherein each of the first and second stacks further includes a third electrode disposed between the first and second electrodes, and
   wherein a sidewall of the third electrode is horizontally spaced apart from the sidewalls of the first and second electrodes.

4. The 3D semiconductor device of claim 1, wherein each of the first and second stacks further includes a third electrode disposed between the first and second electrodes, and
   wherein a sidewall of the third electrode is vertically aligned with the sidewall of the first electrode or the sidewall of the second electrode.

5. The 3D semiconductor device of claim 1, wherein the sidewalk of the first and second electrodes are inclined to top surfaces of the first and second electrodes, respectively, in each of die first and second stacks.

6. The 3D semiconductor device of claim 1, wherein each of the first and second stacks includes a pad portion disposed in the connection region,
   wherein the pad portions of the first and second stacks are disposed at positions vertically and horizontally different from each other,
   wherein the stack structure has a sidewall profile of a first stepwise structure defined by the pad portions of the first and second stacks,
   wherein the pad portion of each of the first and second stacks has a sidewall profile of a second stepwise structure defined by the first and second electrodes,
   wherein the first stepwise structure has a first inclination angle with respect to a top surface of the substrate,
   wherein the first inclination angle is smaller than 90 degrees, wherein the second stepwise structure has a second inclination angle with respect to the top surface of the substrate, and wherein the second inclination angle is greater than the first inclination angle and smaller than 90 degrees.

7. The 3D semiconductor device of claim 1, further comprising:
a plurality of vertical structures penetrating the stack structure in the cell array region; and
a data storage layer disposed between the stack structure and each of the vertical structures.

8. A three-dimensional (3D) semiconductor device comprising:
a substrate including a cell array region and a connection region;
a plurality of stacks vertically stacked on the substrate, each of the plurality of stacks having a pad portion disposed in the connection region, and the each of the plurality of stacks including a plurality of electrodes vertically stacked; and
contact plugs connected to the pad portions of the plurality of stacks, respectively,
wherein ends of top surfaces of the pad portions of the plurality of stacks are horizontally spaced apart from each other by a first distance,
wherein, in at least one of the pad portions of the plurality of stacks, a sidewall of an uppermost electrode of the plurality of electrodes is horizontally spaced apart from a sidewall of a lowermost electrode of the plurality of electrodes by a second distance,
wherein the second distance is less than a half of the first distance, and
wherein each of the contact plugs has a width greater than the second distance.

9. The 3D semiconductor device of claim 8,
wherein the contact plugs are in contact with top surfaces of uppermost electrodes of the pad portions, respectively.

10. The 3D semiconductor device of claim 9, wherein sidewalls of the plurality of electrodes of each of the pad portions are disposed between the contact plugs adjacent to each other.

11. The 3D semiconductor device of claim 8, wherein, in another of the pad portions, a sidewall of another lowermost electrode of the plurality of electrodes is vertically aligned with a sidewall of another uppermost electrode of the plurality of electrodes.

12. The 3D semiconductor device of claim 8, wherein the at least one of the pad portions includes a first electrode, a second electrode, and a third electrode which are sequentially stacked,
wherein a sidewall of the first electrode is horizontally spaced apart from a sidewall of the third electrode by the second distance, and
wherein a sidewall of the second electrode is horizontally spaced apart from the sidewall of the first electrode and the sidewall of the third electrode.

13. The 3D semiconductor device of claim 8, wherein the at least one of the pad portions includes a first electrode, a second electrode, and a third electrode which are sequentially stacked,
wherein a sidewall of the first electrode is horizontally spaced apart from a sidewall of the third electrode by the second distance, and
wherein a sidewall of the second electrode is vertically aligned with the sidewall of the first electrode or the sidewall of the third electrode.

14. The 3D semiconductor device of claim 8, wherein the pad portions include first pad portions and second pad portions,
wherein a number of the plurality of electrodes included in each of the second pad portions is less than a number of the plurality of electrodes included in each of the first pad portions, and
wherein, in the first or second pad portions, a sidewall of an uppermost electrode is horizontally spaced apart from a sidewall of a lowermost electrode by the second distance.

15. A three-dimensional (3D) semiconductor device comprising:
a substrate including a cell array region and a connection region;
a stack structure extending in one direction on the substrate, the stack structure including first electrodes and second electrodes that are alternately and vertically stacked on the substrate with an insulating layer interposed therebetween; and
contact plugs connected to the second end portion of each of the second electrodes, respectively,
wherein each of the first electrodes has a first end portion exposed by each of the second electrodes disposed on each of the first electrodes in the connection region,
wherein each of the second electrodes has a second end portion exposed by each of the first electrodes disposed on each of the second electrodes in the connection region,
wherein the first end portion of each of the first electrodes has a first width in the one direction,
wherein the second end portion of each of the second electrodes has a second width in the one direction,
wherein the first width is less than a half of the second width,
wherein each of the contact plugs has a width that is greater than the first width and smaller than the second width.

* * * * *